(12) United States Patent
Igarashi et al.

(10) Patent No.: US 6,436,804 B2
(45) Date of Patent: Aug. 20, 2002

(54) SEMICONDUCTOR INTEGRATED CIRCUIT DEVICE, SEMICONDUCTOR INTEGRATED CIRCUIT WIRING METHOD, AND CELL ARRANGING METHOD

(75) Inventors: Mutsunori Igarashi; Takashi Mitsuhashi; Masami Murakata; Masaaki Yamada; Fumihiro Minami; Toshihiro Akiyama; Takahiro Aoki, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/810,579

(22) Filed: Mar. 19, 2001

Related U.S. Application Data

(62) Division of application No. 09/338,593, filed on Jun. 23, 1999, now Pat. No. 6,262,487.

(30) Foreign Application Priority Data

Jun. 23, 1998 (JP) ............................. P10-176285

(51) Int. Cl.$^7$ ................................................ H01L 21/44
(52) U.S. Cl. ........................................ 438/617; 257/758
(58) Field of Search ................................ 438/617, 622, 438/118, 618, 625; 257/758, 776

(56) References Cited

U.S. PATENT DOCUMENTS 4,412,240 A * 10/1983 Kikuchi et al. ............... 357/45
4,673,966 A * 6/1987 Shimoyama ................... 357/68
4,791,238 A * 12/1988 Kanno et al. ............... 174/68.5
4,893,170 A * 1/1990 Tokuda et al. ................ 357/71
5,723,908 A * 3/1998 Fuchida et al. ............. 257/758

FOREIGN PATENT DOCUMENTS

| JP | 5-102305 | 4/1993 |
|---|---|---|
| JP | 5-243379 | 9/1993 |
| JP | 7-86414 | 3/1995 |

* cited by examiner

*Primary Examiner*—David Nelms
*Assistant Examiner*—Quoc Hoang
(74) *Attorney, Agent, or Firm*—Foley & Lardner

(57) ABSTRACT

There are disclosed a semiconductor integrated circuit device, a semiconductor integrated circuit wiring method and a cell arranging method, which can reduce delay in a semiconductor integrated circuit and improve noise resistibility, achieve facility of wiring design, and reduce production cost.

The present invention forms an X-Y reference wiring grid using wirings of a total of M (M≧2) layers in which an n-th (n≧2) layer wiring intersects orthogonally with a (n−1)-th layer wiring, and forms an oblique wiring grid which intersects with the reference wiring layer to have an angle of 45 degree or 135 degree is formed by a (m+1)-th layer wiring and a (m+2)-th layer wiring which are intersected orthogonally with each other, such that the(m+1)-th layer wiring and(m+2)-th layer wiring in the oblique wiring grid has a wiring pitch of √2 times of that of wiring in the reference wiring grid, and also wiring widths of √2 times of that of wiring in the reference wiring layer.

10 Claims, 20 Drawing Sheets

BALANCE POINT 270

BUFFER CELL 300
ALTERNATE ROUTE 301

BUFFER CELL 310
ALTERNATE ROUTE 311

START POINT 320
WIRING INNIBIT AREA 330
END POINT 321

320
330
321

320
330
321

GROUND TERMINAL 701

VOLTAGE TERMINAL 702

DIFINITION POSITION FOR OUTPUT TERMINAL 704

INPUT TERMINAL 703

CLOCK WIRING 801

CLOCK WIRING 802

SEMICONDUCTOR INTEGRATED CIRCUIT DEVICE, SEMICONDUCTOR INTEGRATED CIRCUIT WIRING METHOD, AND CELL ARRANGING METHOD

This application is a divisional of application Ser. No. 09/338,593, filed Jun. 23, 1999 now U.S. Pat. No. 6,262,487, which is expressly incorporated by reference in its entirety.

BACKGROUND OF THE INVENTION

1. Field of the Invention

The present invention relates to a semiconductor integrated circuit device having a multilayer wiring structure, a semiconductor integrated circuit wiring method, and a cell arranging method. More particularly, the present invention relates to a semiconductor integrated circuit and a semiconductor integrated circuit wiring technology, which are capable of achieving reduction in signal delay and improvement in noise resistibility in the semiconductor integrated circuit in which a wiring layer formed using oblique wiring grid is stacked on a wiring layer formed using X-Y wiring grid.

2. Related Art

As the multilayer wiring structure of an LSI according to the standard cell method or the gate array method in the prior art, there has been employed a method of stacking wiring layers, which are intersected orthogonally with each other, sequentially as an upper layer. In other words, the n-th layer is provided to intersect orthogonally with the (n−1)-th layer, e.g., the second layer is intersected orthogonally with the first layer, the third layer is intersected orthogonally with the second layer, so on. In such multilayer wiring structure in which respective layers are provided to intersect orthogonally with each other, if two points are to be connected along the diagonal direction of LSI, the points which are separated by a Euclidean distance must be connected. Therefore, a wiring which has a length in excess of a √2 times distance of a linear distance is needed. Accordingly, in the orthogonal type multilayer wiring structure, overhead is caused in both an integration density and a delay characteristic.

However, an approach for designing wirings on the orthogonal coordinate system is convenient for an algorithm in LSI wiring design by using a computer. Therefore, the wirings have been designed by the computer without regard for the above overhead.

Meanwhile, with the progress of microfabrication of the circuit structure, an overall circuit performance is swayed by a delay component generated due to the wiring structure. Therefore, it has been impossible to disregard the above overhead caused when the wiring length is provided longer, as described above.

More particularly, first, a delay component due to the wiring resistance occupies the most part of the critical path delay. In this manner, an influence of the wiring length upon the circuit performance is now increasing.

Also, second, a coupling capacitance between neighboring wirings out of a load capacitance due to the wiring becomes dominant rather than a capacitance between the wiring and a substrate. As a result, in order to improve the circuit performance, it becomes an important factor how to reduce the capacitance between the neighboring wirings.

In addition, third, a malfunction which is caused by the coupling noise due to the coupling capacitance between the neighboring wirings becomes more serious. Particularly, in the wiring structure in the prior art in which all wirings are provided to intersect orthogonally with each other, if the neighboring wirings which are provided to extend in parallel in the same wiring layer are affected mutually, the upper and lower wirings are also extended in parallel even when the wiring is replaced with a wiring being placed in another wiring layer. For this reason, it is difficult to reduce the coupling capacitance between the wirings which are extended in parallel in the same wiring layer.

In connection with the orthogonal type multilayer wiring structure, there has been proposed an oblique wiring technology in which lengths of the wirings are reduced by using the oblique wirings (an oblique angle is 45° or 135°) in addition to the orthogonal wiring structure. For example, such oblique wiring technology has been disclosed in "An automatic layout method of a semiconductor integrated circuit" set forth in Patent Application Publication (KOKAI) Hei 5-102305. This prior art will be explained hereinbelow.

FIG. 1 is a view showing a layout of a wiring grid structure of a semiconductor integrated circuit device utilizing the oblique wirings in the prior art.

In this wiring grid structure, oblique wiring grids are formed as other layers on a layer which constitutes the orthogonal coordinates. In FIG. 1, a reference 401 denotes a wiring grid of a first layer. A wiring grid 402 of a second layer is formed on the first layer to orthogonally intersect with the first layer. In addition, a wiring grid 403 of a third layer is formed on the second layer 402 in the 45° oblique direction relative to the first layer 401, and a wiring grid 404 of a fourth layer is formed on the third layer in the 135° oblique direction relative to the first layer 401.

However, in the prior art, the multilayer wiring technology utilizing the oblique wirings has had problems as follows.

(1) In the multilayer wiring structure in the prior art, since the oblique wiring grid is provided simply, there has been a problem of a discrepancy between grid points. In other words, as shown in FIG. 2, a grid point formed by the first layer 401 and the second layer 402 is indicated by a reference 501 in FIG. 2. While, a grid point formed by the third layer 403 and the fourth layer 404 is indicated by a reference 502. In this case, if a contact hole (via hole) is formed from the fourth layer 404 to the third layer 403, such hole is provided at the grid point 502. On the other hand, if a via hole is formed from the third layer 403 to the second layer 402, such hole is provided at the grid point 501. However, if the grid point 501 is located in the close vicinity of the grid point 502, no via hole can be provided, so that the via hole must be provided at another position. In this way, since discrepancy of the grid points is caused between the overlying oblique wiring lattices (the third layer 403 and the fourth layer 404) and the underlying X-Y wiring lattices (the first layer 401 and the second layer 402), the wiring design has become complicated.

(2) A resistance of the overlying oblique wiring layer becomes equal to the underlying wiring layer. Therefore, even if the oblique wiring layer is employed as the overlying layer, RC delay due to the wiring cannot be reduced. Where the term "RC delay" is delay which is generated by a resistance component R and a capacitance component C. For this reason, the wiring structure which is fitted for the global wiring to connect a long distance cannot be implemented by the overlying oblique wiring layer.

(3) Normally a wiring pitch of the overlying oblique wiring layers is not set wider than a minimum design rule. Therefore, the structure for reducing the neighboring wiring capacitance cannot be achieved by arranging the oblique wiring layer as the overlying layer. As for this respect, the second technology has been disclosed in Patent Application Publication (KOKAI) Hei 7-86414. According to the second technology, wirings located in the layer on which the most severe limitation of a wiring distance by the design rule is imposed are arranged obliquely with respect to the wiring grid on CAD. However, because this prior art cannot provide such a structure that a wiring width is not set wide simultaneously, the above wiring resistance cannot be reduced. In addition, because the coupling capacitance between the neighboring wirings is not reduced, RC delay of the wiring cannot be reduced.

(4) In the prior art, a profile of the via hole is defined as a rectangle. However, if the wirings other than the orthogonal wirings, i.e., the obliquely intersected wirings are connected mutually, it is impossible to assure a necessary and sufficient cut area by the rectangular via hole. Hence, sufficient resistibility for the electromigration phenomenon which brings about disconnection defect of the wiring has not been achieved.

(5) A relationship between the definition of a cell row which is formed by aligning logic cells in a row and the definition of an oblique wiring grid has not been made clear. Therefore, in the event that four wiring layers of two orthogonal wiring layers and two oblique wiring layers, for example, are defined in total, it is evident that wiring resources to be positioned in parallel with the cell row are insufficient. As for this respect, in Patent Application Publication (KOKAI) Hei 5-243379 entitled "Semiconductor Integrated Circuit Device", the technology has been disclosed which can overcome the problem of lack of the wiring resources by defining two oblique wiring layers on three orthogonal wiring layers. However, there has been a problem that, since this technology needs five wiring layers, increase in the cost is caused.

(6) It has been impossible to reduce the cross talk noise, which brings about a malfunction of the circuit, in the same wiring layer. According to the wiring structure having the oblique wiring grid in the prior art, overlying and underlying wiring layers are not overlapped in the same wiring direction. As a result, the coupling capacitance between the wirings formed on the overlying and underlying wiring layers can be reduced small, and therefore the problem of the cross talk noise between the overlying and underlying wiring layers can be overcome. However, since different wirings are formed in parallel on the same wiring layer, the coupling capacitance between the neighboring wirings cannot be reduced. In other words, according to the oblique wiring grid technology in the prior art, it has been impossible to remove the cross talk noise which is generated between two parallel wirings formed on the same wiring layer.

(7) The oblique wiring grid in the prior art is not enough to form the power supply wiring. For instance, in the case that a pad is formed in a core area of the chip constituting a combinational circuit, a part of the pad can be employed as the power supply wiring. (In contrast to the core area, a peripheral area in which I/O of the chip are provided is called an "I/O area".) In this case, the overlying oblique wiring grid layer can be employed as an auxiliary power supply wiring. In such structure, the oblique wiring grid structure in the prior art has a wiring pitch or a wiring width which is not fitted to form a wider wiring. Therefore, such structure has been unsuitable to utilize the overlying oblique wiring grid layer effectively as the power supply wiring.

(8) Since a wiring length of the wiring for supplying a clock from PLL (Phase Locked Loop) to flip-flops in the chip is long, delay has been increased.

Normally, the PLL is arranged on a corner for avoiding aggravation of characteristics of built-in analog circuit in the chip, and then wirings are provided from this corner to the flip-flops. Hence, the wiring which has a length as the shortest route close to a half peripheral length of the chip must be drawn. Accordingly, the delay is increased and the number of steps of the buffer is also increased, whereby a duty ratio of the clock has been badly influenced.

(9) In the case of a memory circuit such as SRAM, since the coupling noise is generated between wirings in the memory circuit and wirings passing over the memory circuit, a performance of the memory circuit is degraded by the passing wirings. Therefore, in the prior art, wiring designs have been conducted so as to avoid the passing wirings which are provided over the memory circuit.

In prior art, there is one technology for shielding the passing wirings which are provided over the memory circuit. However, according to this technology, another layer has also been needed to shield the wirings. As a result, the circuit structure has become complicated.

In addition, in the prior art, there is another technology which employs the passing wirings provided over the memory circuit as small amplitude signal wirings. However, according to this technology, the applicable integrated circuit has been limited.

SUMMARY OF THE INVENTION

The present invention has been made to overcome the above problems in the prior art. It is an object of the present invention to provide a semiconductor integrated circuit device and a semiconductor integrated circuit wiring method, which are able to improve delay characteristic and noise resistibility of a circuit and also achieve facility of wiring design and reduction in production cost by utilizing oblique wiring layers in the semiconductor integrated circuit which employs a multilayer wiring structure in which oblique wiring grids being intersected orthogonally with each other in the oblique direction are provided in addition to wiring grids being intersected orthogonally with each other in the X-Y direction.

According to an aspect of the present invention, there is provided a semiconductor integrated circuit device comprising: a semiconductor area in which a plurality of unit elements are formed; a reference wiring layer which is formed over the semiconductor area and in which an X-Y reference wiring grid comprises a total of M (M≧2) layers where an n-th (n≧2) layer wiring intersects orthogonally with a (n−1)-th layer wiring; and an oblique wiring layer which is positioned over the reference wiring layer and in which an oblique wiring grid which intersects with the reference wiring grid to have an angle of 45 degree or 135 degree, the oblique wiring grid comprising a (m+1)-th layer wiring and a (m+2)-th layer wiring which are intersected orthogonally with each other; wherein each one of the (m+1)-th layer wiring and (m+2)-th layer wiring in the oblique wiring layer has a wiring pitch of $\sqrt{2}$ times of that of wiring in the reference wiring layer, and a wiring width of $\sqrt{2}$ times of that of respective layer in the reference wiring layer.

Preferably the reference wiring layer is composed of two layers or three layers. If the reference wiring layer is composed of three layers, the first layer wirings and the third layer wirings are provided in parallel with the cell row.

Preferably wirings of the oblique wiring layer are employed as global wirings.

According to another aspect of the present invention, the reference wiring layer and the oblique wiring layer constitute routing channel area, and the routing channel area is provided in parallel with a cell row in which logic cells formed of the unit elements are aligned in a row.

According to another aspect of the present invention, via hole for connecting the wirings, being formed at intersecting positions between wiring in the reference wiring layer and wiring in the oblique wiring layer, and the via hole has a sectional shape formed of any one of a hexagon, an octagon, and a parallelogram.

According to another aspect of the present invention, the plurality of unit elements constitute a cell, and the cell has obstruction area which is defined along wiring directions of the oblique wiring layer and in which wiring is not provided.

According to another aspect of the present invention, a part of the wiring of the oblique wiring layer is formed as a power supply wiring for supplying a power supply voltage.

According to another aspect of the present invention, the plurality of unit elements constitute cell which is supplied with a clock signal via tree type wiring route, and the tree type wiring route is constructed by combining unit wiring structures which is formed by connecting first wiring, which is formed by route extended on the wiring of the oblique wiring layer from a first point and a second point so as to come close to each other, and second wiring, which is formed by routes extended on the wiring of the oblique wiring layer from a third point and a fourth point so as to come close to each other, via the wiring in the reference wiring layer.

According to another aspect of the present invention, the semiconductor integrated circuit device further comprising: a flip-flop circuit; and a PLL (Phase Locked Loop) arranged at a corner of a chip; wherein the flip-flop circuit is supplied with a clock signal via tree type wiring route, and the tree type wiring route is provided from the PLL to a center of the chip by using wiring of the oblique wiring layer, and then wiring is hierarchically provided from the center of the chip to the flip-flop circuits via buffer cell so as to balance an RC product.

According to another aspect of the present invention, the semiconductor integrated circuit device further comprising: an SRAM circuit in which wiring of the reference wiring layer is used as its inner wiring; and wherein wiring passing over the SRAM circuit is provided in the oblique wiring layer.

According to another aspect of the present invention, there is provided a method of wiring elements of a semiconductor integrated circuit, comprising the steps of: forming an X-Y reference wiring layer constituting a total of M (M≧2) layers in which an n-th (n≧2) layer wiring intersects orthogonally with a (n−1)-th layer wiring; and forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and(m+2)-th layer wiring in the oblique wiring layer has a wiring pitch of √2 times of that of wiring in the reference wiring layer, and a wiring width of √2 times of that of respective layers in the reference wiring layer.

According to another aspect of the present invention, the method further comprising the steps of: extracting wiring nets which delay in excess of a prescribed delay time from wiring nets constructed by the wiring in the reference wiring layer; and inserting signal amplifying buffer cell into a position, which can be connected to wiring of the oblique wiring layer, on the extracted wiring nets.

According to another aspect of the present invention, the method further comprising the steps of: when one wiring of two parallel wirings, which correspond to two wirings of the M layers of the reference wiring lattice and belong to a same layer, generates noises onto other wiring, replacing a prescribed portion in a middle of any one wiring of two wirings with wiring of the oblique wiring layer.

According to another aspect of the present invention, there is provided a method of arranging cells on a semiconductor integrated circuit, comprising the steps of: forming an X-Y reference wiring layer constituting a total of M (M≧2) layers in which an n-th (n≧2) layer wiring intersects orthogonally with a (n−1)-th layer wiring; forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and(m+2)-th layer wiring in the oblique wiring layer has a wiring pitch of √2 times of that of wiring in the reference wiring layer; and arranging cell consisting of a plurality of unit elements based on a prescribed cut method utilizing X-Y cut lines which correspond to wiring directions of the reference wiring layer and oblique cut lines which correspond to wiring directions of the oblique wiring layer.

According to another aspect of the present invention, there is provided a method of wiring elements of a semiconductor integrated circuit, comprising the steps of: forming an X-Y reference wiring layer constituting a total of M (m≧2) layer in which an n-th (n≧2) layer wiring intersects orthogonally with a (n−1)-th layer wiring; forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and(m+2)-th layer wiring in the oblique wiring layer has a wiring pitch of √2 times of that of wiring in the reference wiring layer; providing wiring from a PLL (Phase Locked Loop) arranged at a corner of a chip to a center of the chip, by using wiring of the oblique wiring layer; and providing hierarchically wiring from the center of the chip to flip-flop circuits in the chip via buffer cells so as to balance an RC product.

According to another aspect of the present invention, there is provided a method of wiring elements of a semiconductor integrated circuit, comprising the steps of: forming an X-Y reference wiring layer constituting a total of M (M≧2) layers in which an n-th (n≧2) layer wiring intersects orthogonally with a (n−1)-th layer wiring; forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and(m+2)-th layer wiring in the oblique wiring layer has a wiring pitch of √2 times of that of wiring in the reference wiring layer; forming an SRAM circuit in which wiring of the reference wiring layer is used as its inner wiring; and forming wiring, which is passed over the SRAM circuit, on the oblique wiring layer.

Other features and advantages of the present invention will become apparent from the following description taken in conjunction with the accompanying drawings.

DETAILED DESCRIPTION OF THE PREFERRED EMBODIMENTS

Embodiments of a semiconductor integrated circuit device and a semiconductor integrated circuit wiring method according to the present invention will be explained in detail with reference to the accompanying drawings hereinafter.

First Embodiment

According to a first embodiment, oblique wiring grids formed of the third layer wiring and the fourth layer wiring, which are inclined by an angle of 45 or 135 degree relative to reference wiring grids respectively and are intersected orthogonally with each other, are provided on the first and second layer reference wiring lattices which are intersected orthogonally with each other. Then, wiring pitches between the third layer wirings and between the fourth layer wirings and wiring widths of the third layer wiring and the fourth layer wiring of the oblique wiring grids are set √2 times of the wiring pitches of the reference wiring grids. Thus, a wiring length can be reduced, RC delay can be reduced, and noise resistibility can be improved.

Figure 3:
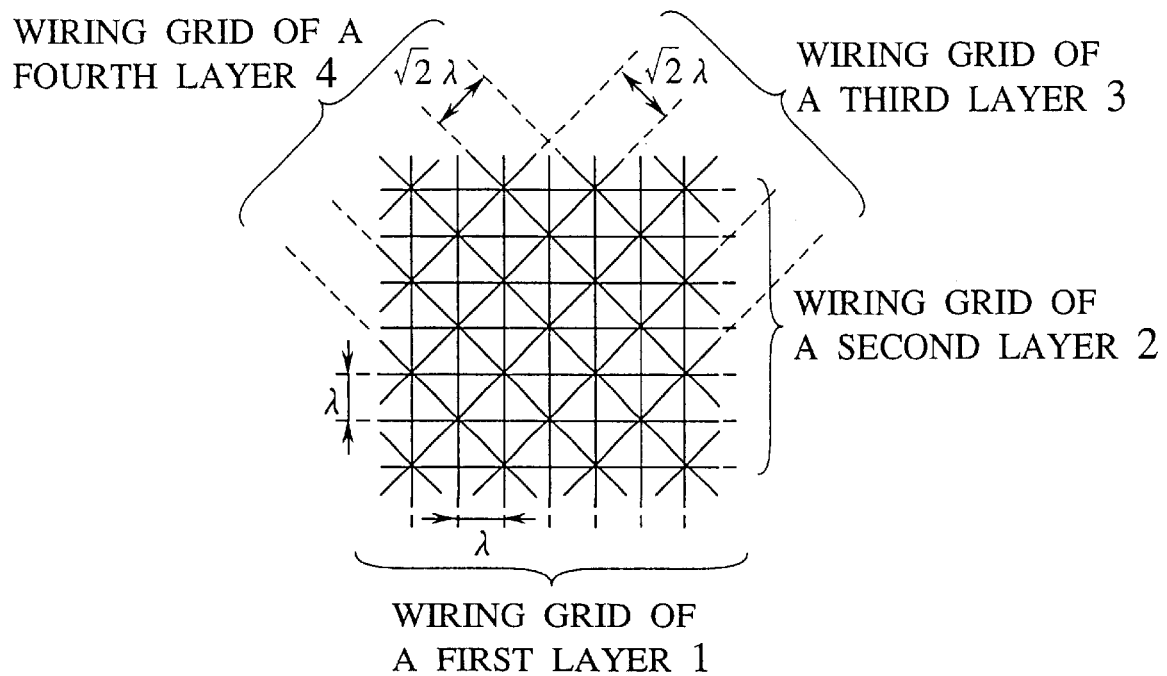
FIG. 3 is a view showing a layout of a wiring grid structure of a semiconductor integrated circuit device according to a first embodiment of the present invention.
Figure 4:
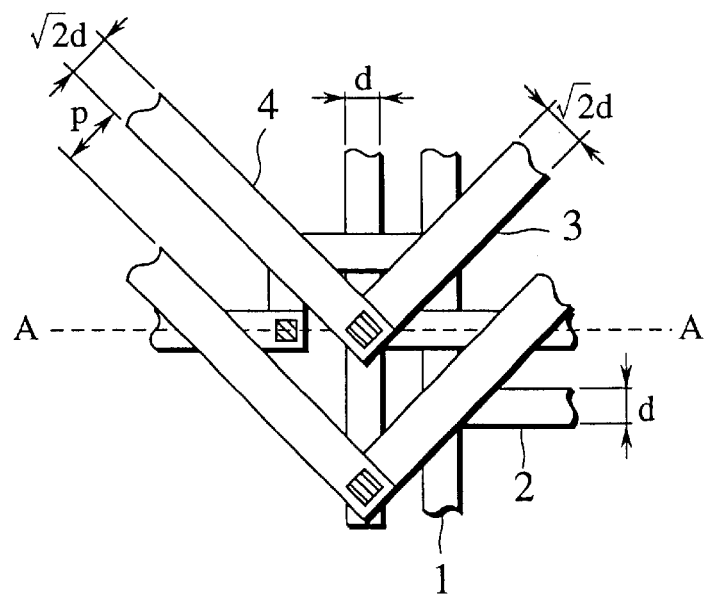
FIG. 4 is a plan view showing an example of a wiring structure when wirings are provided based on the wiring grid structure shown in FIG. 3.
Figure 5:
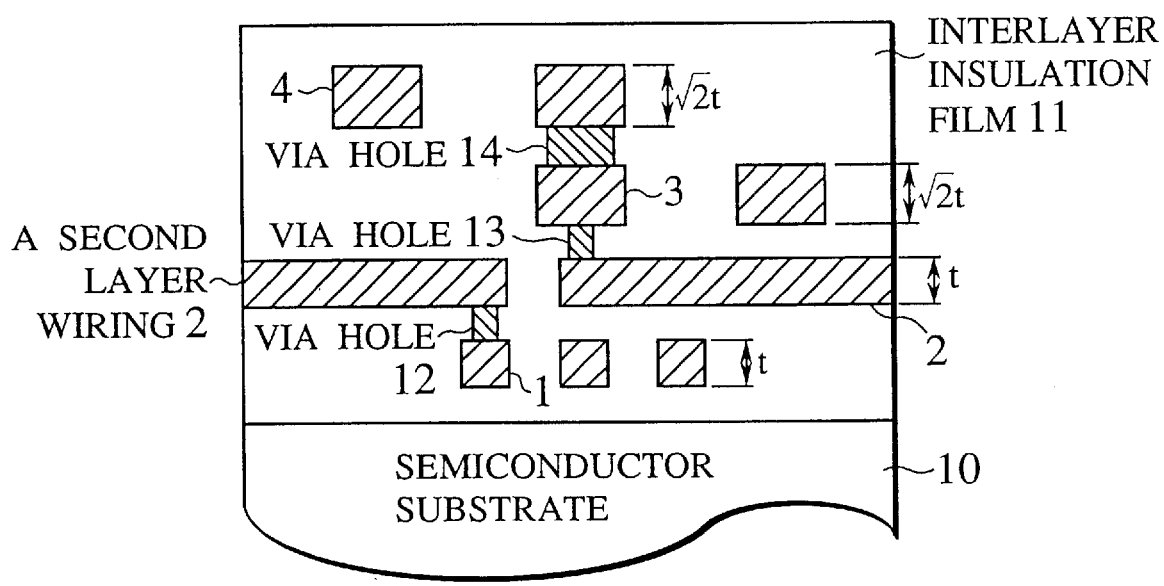
FIG. 5 is a sectional view showing the sectional wiring structure taken along an A—A line in FIG. 4.

FIG. 3 is a view showing a layout of a wiring grid structure of a semiconductor integrated circuit device according to the first embodiment of the present invention. FIG. 4 is a plane view showing an example of a wiring structure when wirings are provided based on the wiring grid structure shown in FIG. 3. FIG. 5 is a sectional view showing the sectional wiring structure taken along an A—A line in FIG. 4.

Figure 1:
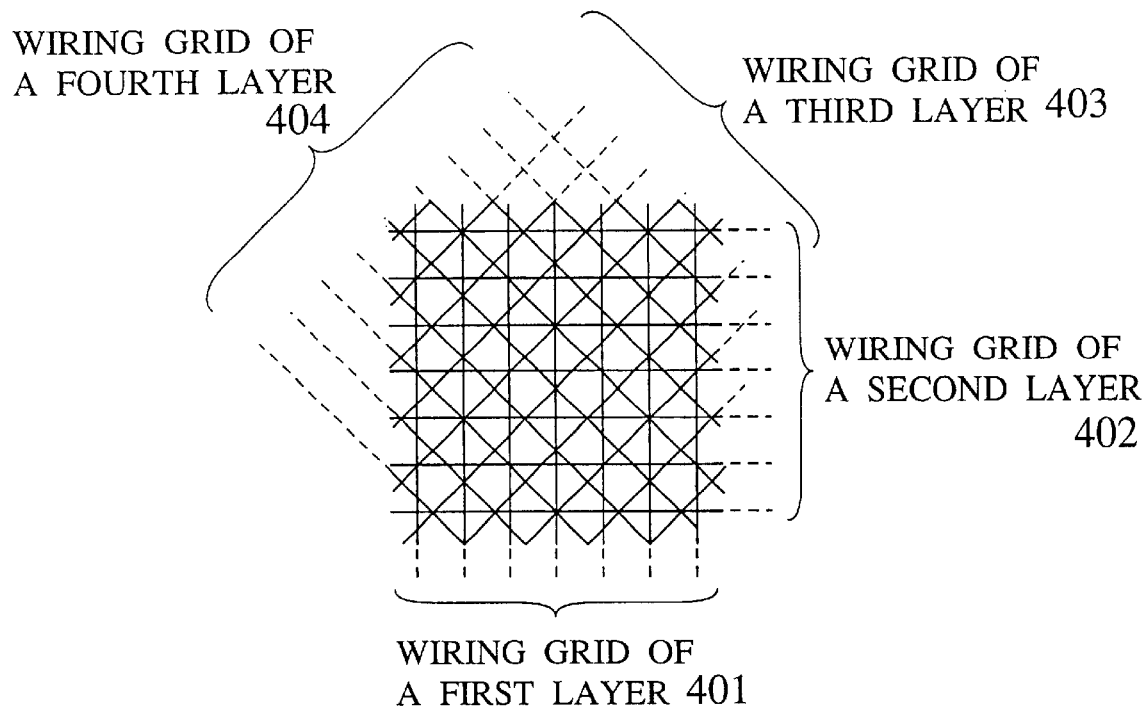
FIG. 1 is a view showing a layout of a wiring grid structure of a semiconductor integrated circuit device utilizing oblique wirings in the prior art.
Figure 2:
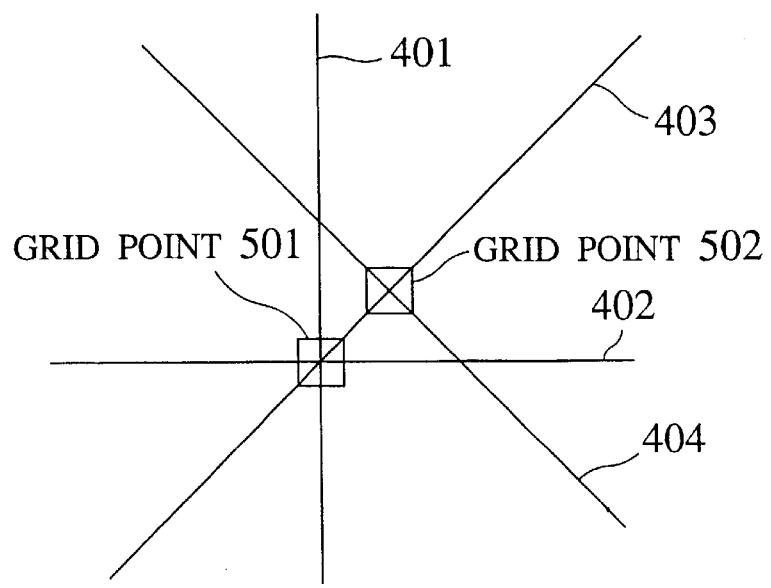
FIG. 2 is a view showing a problem of a discrepancy between the grid points in the prior art.

As shown in FIG. 3, like the prior art in FIG. 1, the wiring structure according to the first embodiment, wiring grids of the first layer wiring and the second layer wiring are intersected orthogonally with each other, and also wiring grids of the third layer wiring and the fourth layer wiring are intersected orthogonally with each other. In other words, the wiring grids of the third layer and the fourth layer are placed so as to intersect with that of the first layer by 45° or 135° respectively.

In FIG. 3, a reference 1 denotes the wiring grid of the first layer. The wiring grid 2 of the second layer is formed on the first layer to intersected orthogonally with the first layer. Further, the wiring grid 3 of the third layer and the wiring grid 4 of the fourth layer are placed sequentially in the 45° and 135° oblique directions respectively with respect to the wiring grid 1 of the first layer.

In the first embodiment, wiring pitches of the wiring grid 3 of the third layer and the wiring grid 4 of the fourth layer in oblique wiring layer are set wider than those of the wiring grid 1 of the first layer and the wiring grid 2 of the second layer respectively. More particularly, the wiring pitches of the wiring grid 3 of the third layer and the wiring grid 4 of the fourth layer are set $\sqrt{2}$ times ($\sqrt{2}\cdot\lambda$) of those ($\lambda$) of the wiring grid 1 of the first layer and the wiring grid 2 of the second layer respectively.

Therefore, discrepancy of the grid points between the overlying X-Y wiring grids (i.e., the wiring grid 3 of the third layer and the wiring grid 4 of the fourth layer) and the underlying oblique wiring grids (i.e., the wiring grid 1 of the first layer and the wiring grid 2 of the second layer) can be avoided. For this reason, the wiring design can be facilitated. That is to say, via holes between the second layer and the third layer can be placed on intersection points of the wiring grid 1 of the first layer and the wiring grid 2 of the second layer, so that neighboring grids can be employed in the wirings of the first layer and the second layer.

Further, a feature of the first embodiment resides in that wiring widths of the wirings of the third layer and the fourth layer, which are placed in the oblique direction to have the wiring pitch ($\sqrt{2}\cdot\lambda$), are set wider than those of the wirings of the first layer and the second layer. More particularly, as shown in FIG. 4, the wiring widths of the wirings of the third layer and the fourth layer are set $\sqrt{2}$ times ($\sqrt{2}\cdot d$) of those (d) of the wirings 1 of the first layer and the wirings 2 of the second layer respectively. As described above, since the wiring pitches of the wirings 3, 4 of the third layer and the fourth layer are set $\sqrt{2}$ times, there is no case where the wiring interval indicated by p in FIG. 4 is against the design rule. As a result, the wiring width can be expanded without contradiction to the design rule.

In the example shown in FIG. 5, at first the wirings 1 of the first layer are placed in the vertical direction, and then the wirings 2 of the second layer are placed in the orthogonal direction with the vertical direction with respect to the wirings of the first and second layers. On the contrary, the wirings 3 of the third layer and the wirings 4 of the fourth layer are placed in the oblique direction. In FIG. 5, a reference 12 denotes a via hole which is provided between the wiring 1 of the first layer and the wiring 2 of the second layer, a reference 13 denotes a via hole which is provided between the wiring 2 of the second layer and the wiring 3 of the third layer, and a reference 14 denotes a via hole which is provided between the wiring 3 of the third layer and the wiring 4 of the fourth layer.

In the first embodiment, based on the premise of above features of the wiring pitches and the wiring widths, wiring thicknesses of the wirings 3 of the third layer and the wirings 4 of the fourth layer which are placed in the orthogonal direction are set larger than those of the wirings 1 of the first layer and the wirings 2 of the second layer. More particularly, as shown in FIG. 5, the wiring thicknesses of the wirings 3 of the third layer and the wirings 4 of the fourth layer are set $\sqrt{2}$ times ($\sqrt{2}\cdot t$) of those (t) of the wirings 1 of the first layer and the wirings 2 of the second layer respectively. In this case, in FIG. 5, a reference 10 denotes a semiconductor substrate on which transistors are formed, and a reference 11 denotes an interlayer insulating film.

Because of the structure in which the wiring widths and the wiring thicknesses of the wiring 3 of the third layer and the wiring 4 of the fourth layer are set $\sqrt{2}$ times of those of the wiring 1 of the first layer and the wiring 2 of the second layer respectively, respective cross sectional areas of the wiring 3 of the third layer and the wiring 4 of the fourth layer are 2 times of those of the wiring 1 of the first layer and the wiring 2 of the second layer, as indicated by a following expression.

$$\sqrt{2}\times\sqrt{2}=2$$

Therefore, the wiring resistances per unit length of the wiring 3 of the third layer and the wiring 4 of the fourth layer are reduced half (½) of the wiring 1 of the first layer and the wiring 2 of the second layer respectively. Meanwhile, an opposing area between the neighboring wirings of the third layer and the fourth layer becomes $\sqrt{2}$ times, but a wiring interval between the neighboring wirings of the third layer and the fourth layer also becomes $\sqrt{2}$ times. As a result, a capacitance between the neighboring wirings of the third layer and the fourth layer is equal to that between the neighboring wirings of the first layer and the second layer. Since the wiring resistance is reduced half but the capacitance between the neighboring wirings is equal, RC delay of the wiring per unit length can be reduced half of the wiring 1 of the first layer and the wiring 2 of the second layer. Here "RC delay of the wiring" means delay which is caused by a resistance component and a capacitance component of the wiring.

As described above, according to the first embodiment, the wiring pitches between the wirings of the third layer and the wirings of the fourth layer are set $\sqrt{2}$ times of those between the wirings of the first layer and the wirings of the second layer. Therefore, discrepancy of the grid points between the overlying oblique wiring grids and the underlying reference wiring grids can be avoided, so that the wiring design can be facilitated.

Furthermore, since the wiring widths are also set $\sqrt{2}$ times, the RC delay of the wiring can be reduced. In addition, since the wiring thicknesses are also set $\sqrt{2}$ times, the RC delay of the wiring can be reduced much more. As a consequence, from such a viewpoint that an operation speed can be improved employing the relatively long wiring, a considerable advantage can be achieved.

Second Embodiment

According to a second embodiment, in the multilayer wiring structure in which the oblique wiring grids according to the first embodiment are utilized, generation of timing error due to the wiring delay can also be prevented by inserting a repeater cell (buffer cell) into the wiring.

Figure 6A:
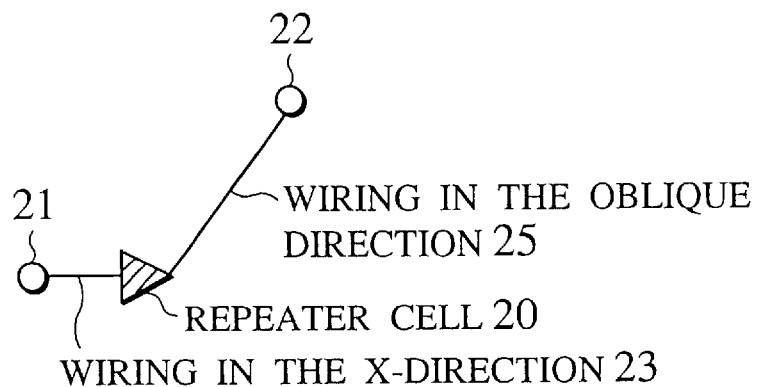
FIGS. 6A to 6D are views each showing a repeater cell inserting approach used in a semiconductor integrated circuit device according to a second embodiment of the present invention.
Figure 6B:
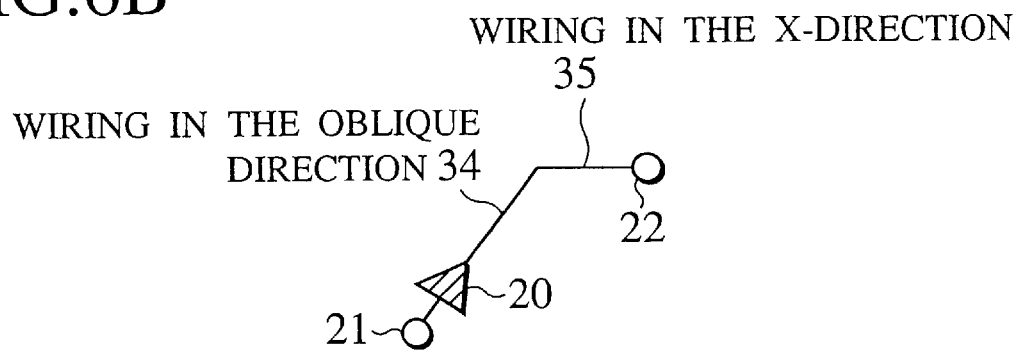
Figure 6C:
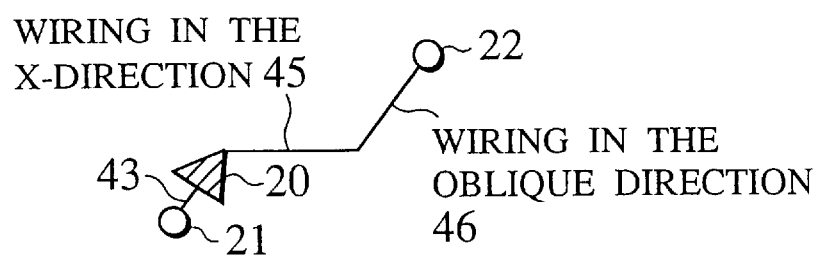

FIGS. 6A to 6D are views each showing a repeater cell inserting approach employed in the second embodiment of the present invention. FIGS. 7A and 7B are views showing the wiring delay respectively. Procedures for inserting the repeater cell according to the second embodiment will be explained concretely with reference to FIGS. 6A to 6D and FIGS. 7A and 7B hereunder.

To begin with, while using merely the first layer and the second layer, all nets are wired by the X-Y wirings. Then, delay analysis is carried out by the simulator to extract the net in which the timing error occurs. Following processes are applied to the extracted nets.

Then the repeater cell is inserted into the net in which the timing error occurs. While using the third layer and the fourth layer as positions into which the repeater cell is inserted, the repeater cell is inserted into a position which can be connected to the oblique wirings. A wiring length can be reduced by using the third layer or the fourth layer.

Figure 6D:
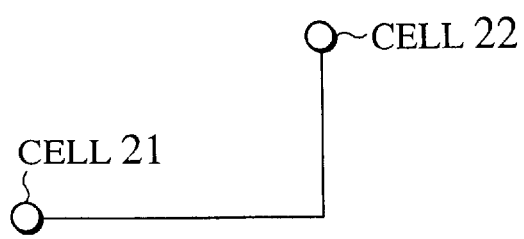
Figure 7A:
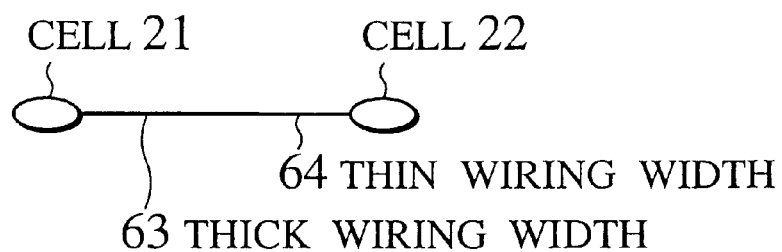
FIGS. 7A and 7B are views each showing wiring delay.
Figure 7B:
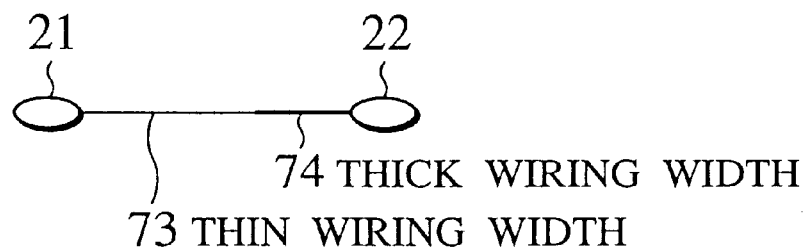

For instance, assume that the timing error occurs in the net shown in FIG. 6D. In this net, as an insertion position of a repeater cell 20 and a wiring direction between a cell 21 and a cell 22, three types shown in FIGS. 6A, 6B, and 6C can be thought about. In an example in FIG. 6A, first an X-direction wiring 23 is provided, then the repeater cell 20 is inserted, and then an oblique wiring 25 is provided. In an example in FIG. 6B, first the repeater cell 20 is inserted, then an oblique wiring 34 is provided, and then an X-direction wiring 35 is provided. In an example in FIG. 6C, first the repeater cell 20 is inserted, then an X-direction wiring 45 is provided, and then an oblique wiring 46 is provided.

Difference of the insertion position of the repeater cell in FIGS. 6A, 6B, and 6C brings about difference of delay distribution between the signal input cell 21 to the repeater cell 20 and the repeater cell 20 to the signal output cell 22. If the example in FIG. 6A is compared with the example in FIG. 6B, the delay caused between the cell 21 and the repeater cell 20 in FIG. 6B is smaller than that in FIG. 6A. In contrast, the delay caused between the repeater cell 20 and the cell 22 in FIG. 6A is smaller than that in FIG. 6B. It depends on respective transistor sizes of the cell 21 and the repeater cell 20 which example can reduce the actual delay. Therefore, normally the application of the final insertion position of the repeater cell and the wiring direction must be decided after the delay has been analyzed in all thinkable combinations of cells. However, evidently the delay in the example in FIG. 6C is increased rather than other examples.

As for the wiring width, according to Elmore's wiring delay computational equation, the wiring delay can be reduced when the wiring width is narrowed gradually from the cell from which the signal is output. More particularly, the wiring delay in the example shown in FIG. 7A, in which first a thick wiring width 63 is applied and then a thin wiring width 64 is used, can be reduced rather than the example shown in FIG. 7B, in which first a thin wiring width 73 is applied and then a thick wiring width 74 is used.

Since the oblique wirings are made thicker $\sqrt{2}$ times than the X-Y wirings, the wiring delay can be reduced in the case where first the oblique wirings are applied and then the X or Y wirings are used rather than the case where first the X or Y wirings are applied and then the oblique wirings are used. That is to say, it can be understood that the wiring delay can be reduced in the example in FIG. 6B rather than the example in FIG. 6C.

Accordingly, in the case that the oblique wiring is employed, rules in inserting the repeater cell can be defined as follows.

(1) The oblique wiring should be connected to the wiring located near the signal output terminal.

(2) The oblique wiring should be connected to the signal output terminal.

(3) The oblique wiring should be used as often as possible as the wiring located near the signal output terminal of the repeater cell.

(4) The oblique wiring should be connected to the signal output terminal of the repeater cell.

(5) The repeater cell should be arranged at a position where the oblique wiring can be connected to the signal output terminal.

In compliance with the above rules, a structure of the repeater cell can also be defined as follows.

(1) The signal input terminal should be formed such that it can be made easier to connect such terminal to the X-Y wirings. That is, the signal input terminal should be formed on the first layer.

(2) In addition, the signal output terminal should be formed such that it can be made easier to connect such terminal to the oblique wirings. That is, the signal output terminal should be formed on the third layer.

As described above, according to the second embodiment, when the repeater cell for transferring and amplifying the signal should be inserted into the wiring net in order to prevent generation of the timing error due to the wiring delay, such repeater cell can be inserted into the position which can be connected to the oblique wiring grids after the oblique wiring grids are provided. Therefore, the wiring length can be shortened by inserting the repeater cell under the optimum condition, so that the wiring delay can be further reduced.

Third Embodiment

According to a third embodiment, in the multilayer wiring structure in which the oblique wiring grids according to the above embodiments are utilized, routing channels are provided in parallel with the cell row so as to overcome the lack of wiring resource along the cell row direction.

Figure 8:
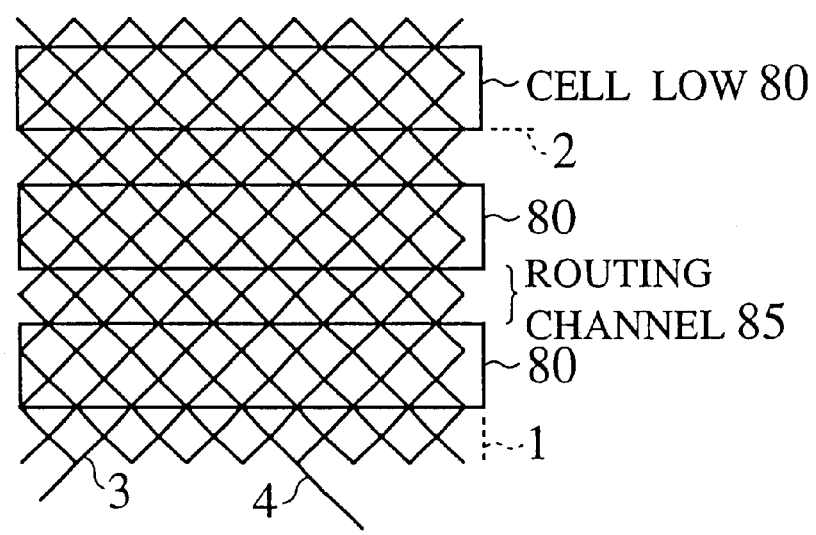
FIG. 8 is a view showing a layout of a structure of a semiconductor integrated circuit device according to a third embodiment of the present invention.

FIG. 8 is a view showing a layout of a structure of a semiconductor integrated circuit device according to the third embodiment of the present invention.

The semiconductor integrated circuit device in FIG. 8 has a plurality of cell rows 80 each of which is formed by aligning the logic cells in a row. The multilayer wirings which have the oblique wiring grids shown in FIG. 3 are formed on the plurality of cell rows 80.

In more detail, in FIG. 8, a reference 1 denotes a metal wiring of the first layer; 2, a metal wiring of the second layer; 3, a metal wiring of the third layer; and 4, a metal wiring of the fourth layer. In the structure in FIG. 8, a routing channel 85 consisting of the metal wirings 1, 2, 3, 4 is formed in the direction parallel with the cell row 80. That is, the wiring channel 85 is provided in parallel with the cell row 80. For this reason, the wiring resource in the cell row direction, which needs more wiring resource, can be assured by fewer wiring layers.

As described above, according to the third embodiment, the lack of the wiring resource in the cell row direction, which needs more wiring resource, can be overcome by fewer wiring layers, and thus the wiring resource can be assured.

Fourth Embodiment

According to a fourth embodiment, in the multilayer wiring structure in which the oblique wiring grids according to the above embodiments are utilized, a profile of a via hole is improved such that a cut area of the via hole for connecting the obliquely intersecting wirings does not become insufficient.

FIGS. 9A to 9D are partial plane views each showing a profile of a via hole of a semiconductor integrated circuit device according to the fourth embodiment of the present invention.

In the multilayer wiring structure which includes the oblique wiring grids shown in FIG. 3, in order to connect the X-Y wirings (the first layer or the second layer) and the oblique wirings (the third layer or the fourth layer) which are formed to have an angle of 45° or 135° relative to the X-Y wirings, the semiconductor integrated circuit device according to the fourth embodiment employs the via hole whose vertical sectional shape is formed as an octagon, a parallelogram, or a hexagon, as shown in FIGS. 9A to 9D. The via hole cut which has a necessary and sufficient sectional area can be formed between the intersecting wiring layers by using the via hole having one of these sectional profiles.

Figure 9A:
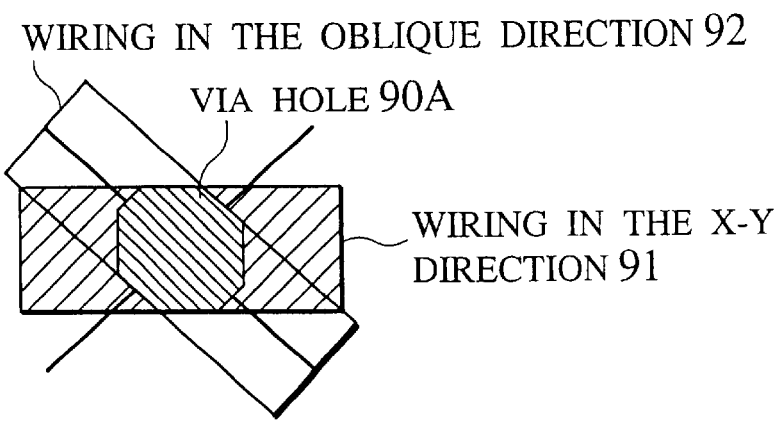
FIGS. 9A to 9D are partial plane views each showing a profile of a via hole of a semiconductor integrated circuit device according to a fourth embodiment of the present invention.

In the example in FIG. 9A, an octagonal via hole 90A is formed at an intersecting point of an X-Y wiring 91 and an oblique wiring 92. Also, in the example in FIG. 9B, a parallelogrammatic via hole 90B is formed at the intersecting point of the X-Y wiring 91 and the oblique wiring 92.

Figure 9B:
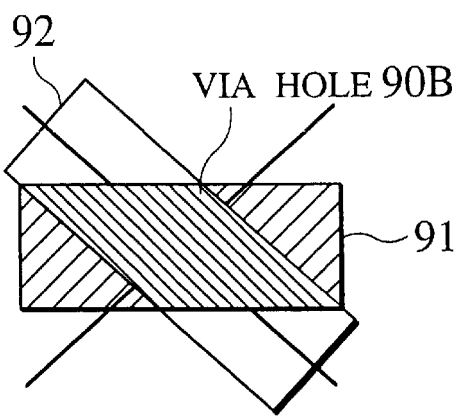
Figure 9C:
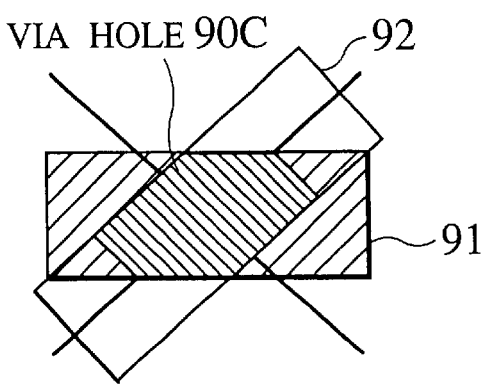
Figure 9D:
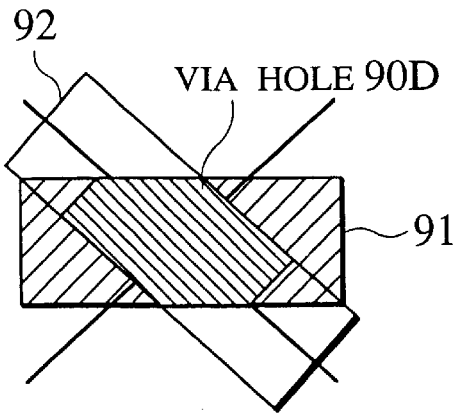

In this case, abnormal proximity of the via holes may happen in the example in FIG. 9B. In order to avoid this event, hexagonal profiles shown in FIG. 9C and FIG. 9D can be provided. In the example in FIG. 9C, a hexagonal via hole 90C is formed at the intersecting point of the X-Y wiring 91 and the oblique wiring 92. Also, in the example in FIG. 9D, a hexagonal via hole 90D is formed at the intersecting point of the X-Y wiring 91 and the oblique wiring 92.

As described above, according to the fourth embodiment, a sectional shape of the via hole for connecting the obliquely intersecting wirings is formed as the octagon, the parallelogram, or the hexagon. Therefore, a cut area of the via hole for connecting the obliquely intersecting wirings can be assured sufficiently.

Fifth Embodiment

According to a fifth embodiment, in the multilayer wiring structure in which the oblique wiring grids according to the above embodiments are utilized, an obstruction area for the wiring is defined optimally.

Figure 10A:
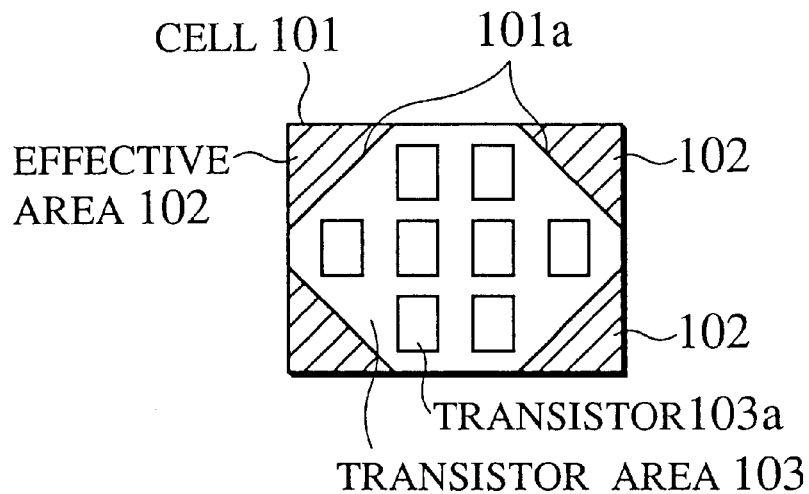
FIGS. 10A and 10B are views showing a cell or a megacell in a semiconductor integrated circuit device according to a fifth embodiment of the present invention respectively.
Figure 10B:
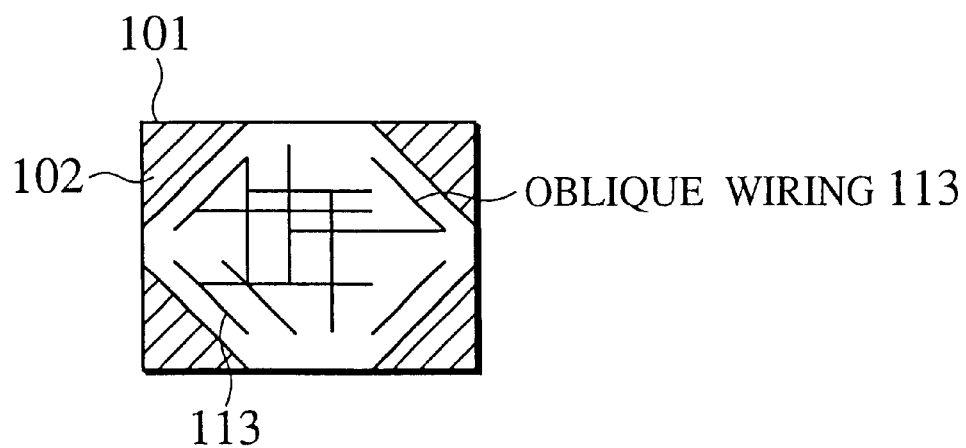

FIGS. 10A and 10B are views showing a cell or a megacell in a semiconductor integrated circuit device according to the fifth embodiment of the present invention respectively.

A reference 101 shown in FIG. 10A denotes a cell in which a plurality of unit elements are formed or a megacell in which a plurality of cells are combined together. The cell or megacell 101 is split into effective areas 102 and a transistor area 103 by 45° lines 101a at four corners. Transistors and lower order cells 103a are arranged in the transistor area 103. While, for example, for the purpose of relaxing the wiring complexity caused near four corners of the cell, etc. (to be described later), the effective areas 102 are provided to utilize effectively four corners of the cell, so that the transistors and the lower order cells 103a are not arranged in the effective areas 102. Explanation will be made hereinafter under the assumption that the cell includes the above megacell.

Further, as shown in FIG. 10B, the above 45° or 135° oblique wirings 113 may be employed as the wirings which are to be arranged in the transistor area 103, particularly in the close vicinity of the lines 101a at four corners of the above cell 101.

In this manner, since the above effective areas 102 are provided not to utilize four corners in designing the cell or megacell, the obstruction for the wiring can be defined along the 45° or 135° oblique wirings. This respect will be explained hereunder.

Figure 11A:
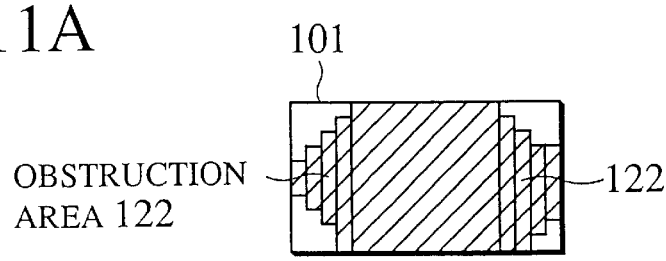
FIGS. 11A and 11B are views showing an example of an obstruction for wiring in the fifth embodiment of the present invention respectively.
Figure 11B:
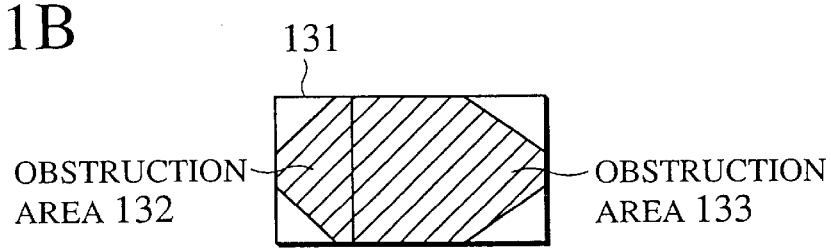

FIGS. 11A and 11B are views showing an example of the obstruction for the wiring according to the fifth embodiment of the present invention respectively. In an example shown in FIG. 11A, the obstruction areas in the cell 101 are defined by using an ensemble of small rectangles 122. Where the term "obstruction area" means an area to define the obstruction for the wiring in wiring design.

In an example shown in FIG. 11B, the obstruction areas in the cell 101 are defined by using a polygon or an ensemble of polygons. In other words, in the example shown in FIG. 11B, in case two obstruction areas are present, they are defined by using trapezoids 132, 133 respectively.

The example shown in FIG. 11A has a drawback that a large amount of data is needed in CAD design, whereas the obstruction areas can be defined by a small amount of data in the example shown in FIG. 11B.

Figure 12A:
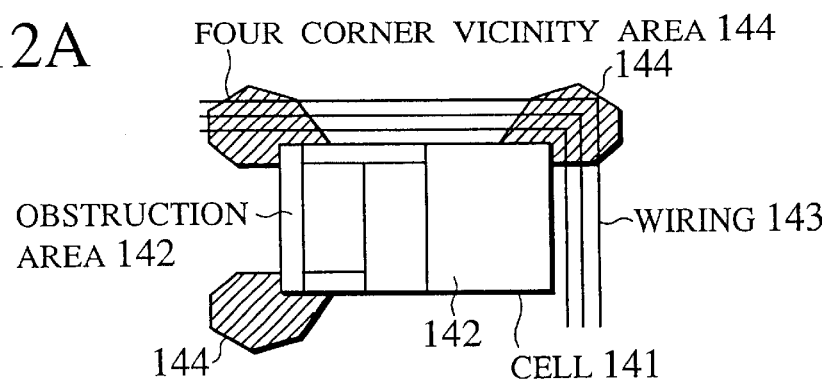
FIGS. 12A and 12B are views showing an obstruction area for wiring and wirings in the fifth embodiment of the present invention respectively.
Figure 12B:
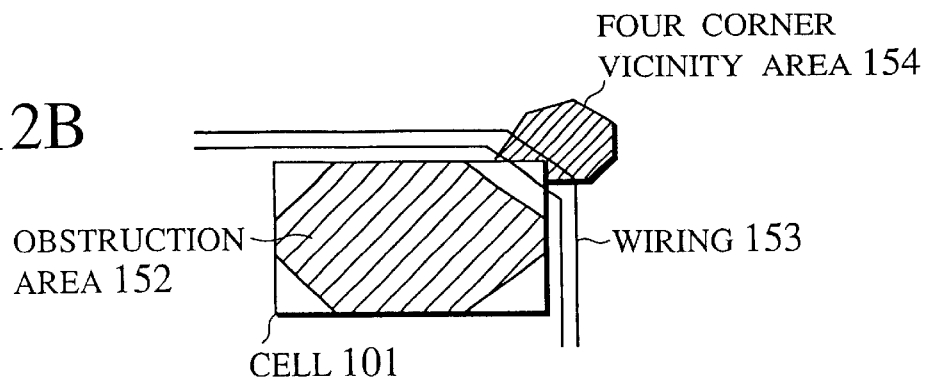

FIGS. 12A and 12B are views showing an advantage being achieved by the fifth embodiment of the present invention respectively.

As shown in FIG. 12A, in the normal X-Y wiring grid model, an obstruction area 142 in a cell or megacell 141 is defined as an ensemble of orthogonal rectangles. If the orthogonal wirings are applied by using the cell or megacell 141, the wiring complexity of the wirings 143 is increased in four corner vicinity areas 144. Thus, there has been such a problem that the integration density of the chip is lowered due to such wiring complexity.

In contrast, if the wirings are effected by using the cell or megacell 101 formed according to the approach in the above-mentioned fifth embodiment, an obstruction area 152 is defined as a structure in which four corners of the cell or megacell are not employed, as shown in FIG. 12B. Therefore, the complexity of the wirings 153 in four corner vicinity areas 154 can be relaxed and thus the integration density of the chip can be improved.

As described above, according to the fifth embodiment, in the design of the cell or megacell, the obstruction area can be defined along the oblique wirings as the structure in which four corners of the cell or megacell are not employed. Hence, the four corners of the cell or megacell can be utilized effectively. In addition, the complexity of the wirings in four corner vicinity areas can be relaxed, and thus the integration density of the chip can be improved.

Sixth Embodiment

According to a sixth embodiment, in the multilayer wiring structure in which the oblique wiring grids according to the above embodiments are utilized, a cross talk noise generated when the wirings are arranged in parallel on the same layer can be suppressed.

Figure 13A:
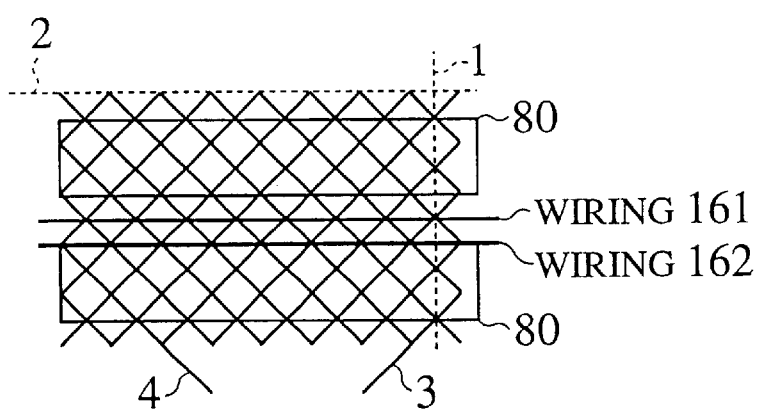
FIGS. 13A to 13C are views each showing a substantial part structure of a semiconductor integrated circuit device according to a sixth embodiment of the present invention.
Figure 13B:
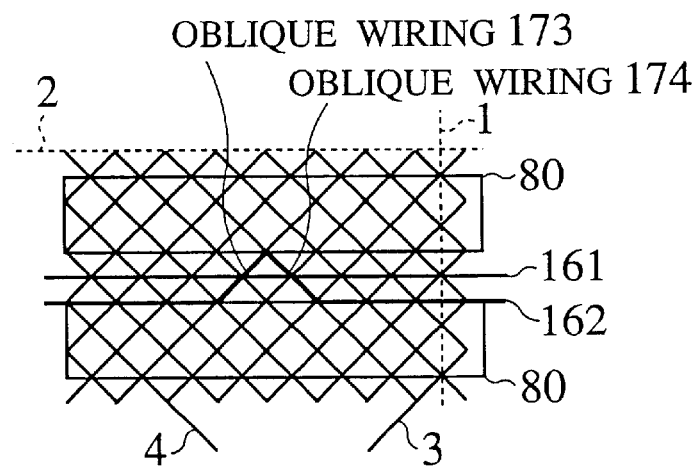
Figure 13C:
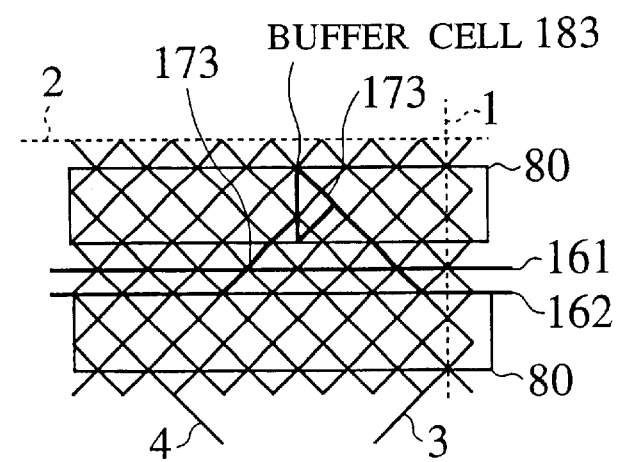

FIGS. 13A to 13C are views each showing a substantial part structure of a semiconductor integrated circuit device according to the sixth embodiment of the present invention. In FIGS. 13A to 13C, the like references are affixed to the like elements in FIG. 8 and their explanation will be omitted.

As shown in FIG. 13A, the case where wirings 161, 162 are arranged in parallel on the same layer will be considered. In the sixth embodiment, the wiring layer is exchanged such that, as shown in FIG. 13B, the middle portion of any one of the wirings (e.g., the wiring 162) is replaced with oblique wirings 173, 174 which are provided to have angles of 45° and 135° relative to the wiring 162 respectively. Because of replacement of the wiring, a distance of parallel lines provided by two wirings formed on the same layer can be shortened and thus generation of the cross talk noise can be suppressed.

Assume that, for example, the wiring 161 of the parallel wirings 161, 162 generates the noise and the wiring 162 receives the noise, one or a plurality of buffer cells 183 are inserted onto the oblique wirings 173, 174 when the wiring 162 is exchanged by the above oblique wirings 173, 174.

In this way, it is feasible to prevent perfectly the propagation of the noise by inserting the buffer cell into the route of the oblique wirings. For example, if a parallel distance of the wirings is limited such that a voltage level of the cross talk noise generated between two wirings which are arranged in parallel on the same layer does not exceed a logical threshold value of the buffer cell 183 which is inserted as the noise canceling cell, the cross talk noise can be suppressed completely.

As described above, according to the sixth embodiment, the wiring layer is exchanged such that the middle portion of any one of the wirings being arranged in parallel on the same layer is replaced with oblique wirings. In addition, the buffer cell is inserted into the route of the oblique wiring being employed in replacement. As a result, the parallel distance of two wirings formed on the same layer can be reduced, and thus generation of the cross talk noise between the wirings can be suppressed.

Seventh Embodiment

According to a seventh embodiment, in the multilayer wiring structure in which the oblique wiring grids according to the above embodiments are utilized, the wiring resource for the oblique wiring grids is employed as the power supply wiring resource.

Figure 14:
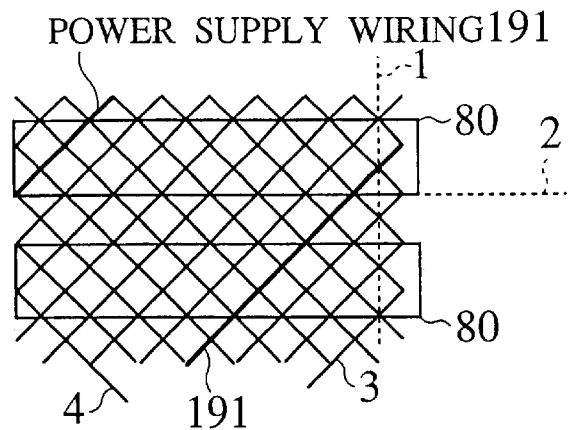
FIG. 14 is a view showing a substantial part structure of a semiconductor integrated circuit device according to a seventh embodiment of the present invention.

FIG. 14 is a view showing a substantial part structure of a semi-conductor integrated circuit device according to the seventh embodiment of the present invention. In FIG. 14, the like references are affixed to the like elements in FIG. 8 and their explanation will be omitted.

As shown in FIG. 14, a part of the wirings 3 of the third layer and the wirings 4 of the fourth layer which are positioned over the wirings 1 of the first layer and the wirings 2 of the second layer are employed as power supply wirings 191 to supply the power supply voltage. Accordingly, the power supply which is short in the cell row 80 can be supplemented by using a part of the wiring resource for the normal signal lines arranged in the oblique direction as the power supply wiring.

As described above, according to the seventh embodiment, a part of the wiring resource for the normal signal lines arranged in the oblique direction is employed as the power supply wiring. As a result, the power supply which is deficient in the cell row can be supplemented.

Eighth Embodiment

According to an eighth embodiment, in the multilayer wiring structure in which the oblique wiring grids according to the above embodiments are utilized, cell arrangement (placement) is optimized.

Figure 15A:
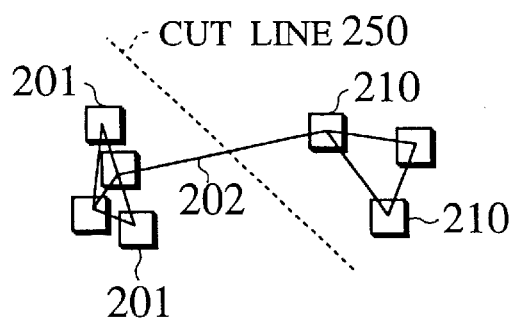
FIGS. 15A and 15B are views each showing a cell arrangement method used in a semiconductor integrated circuit device according to an eighth embodiment of the present invention.
Figure 15B:
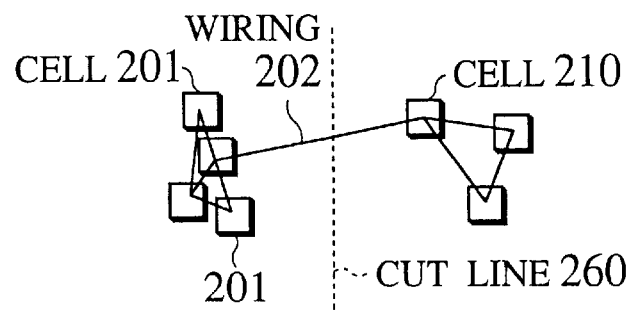

FIGS. 15A and 15B are views each showing a cell arrangement method used in a semiconductor integrated circuit device according to the eighth embodiment of the present invention.

In the LSI design by using CAD, usually the cell arrangement method is effected so as to reduce the wiring length with regard to easiness of the wiring. At that time, a following approach using the top-down approach is applied to the operation to arrange respective cells in appropriate positions.

According to the approach in the prior art, as shown in FIG. 15B, first an ensemble of the cells which are to be arranged hereunder is divided into two parts by a longitudinal and lateral cut line 260. Then, cells 201, 210 are arranged such that a number of wirings which is crossing the cut line 260 can be reduced. Then, a twofold division is executed by using the cut line in the same way, and then such twofold division is repeated until all areas of the LSI are reduced to a minimum unit. The above approach in the prior art is called the minimum-cut method.

In this case, as shown in FIG. 15B, the cut lines 260 in the prior art are provided as longitudinal or lateral straight lines so as to correspond to the X-Y wiring lattices. However, if the above oblique wirings are provided, the 45° wirings appear as the obstruction for the wiring, for example, as described in the fifth embodiment. As a result, the optimum cell positions cannot be designed only by the longitudinal or lateral cut lines 260.

Therefore, as shown in FIG. 15A, in the eighth embodiment, the oblique cut line 250 is utilized in addition to the longitudinal/lateral orthogonal cut lines in the prior art. The cells 201, 210 are arranged such that the number of wirings to cross the oblique cut line 250 can be minimized. As a result, the cell position can be decided such that optimum wirings can be attained in the longitudinal, lateral, and oblique directions, so that the integration degree of LSI can be improved.

As described above, according to the eighth embodiment, when the cell arrangement is designed in LSI design, such cell arrangement may be conducted by the minimum-cut method using the oblique cut line. Hence, the cell position can be optimized so as to accomplish the optimum wirings in the multilayer wiring structure which uses the oblique wiring grids. Thus, the integration density of LSI can be improved.

Ninth Embodiment

According to a ninth embodiment, in the multilayer wiring structure in which the oblique wiring grids according to the above embodiments are utilized, variation in the RC delay of the wiring can be reduced by optimizing a structure of a clock tree in clock supply wiring design when the oblique wirings are employed.

FIGS. 16A to 16D are views each showing a basic structure of a clock tree in a semiconductor integrated circuit device according to the ninth embodiment of the present invention.

In order to provide delay of a clock signal to every route path, normally a tree type wiring structure is employed. In this case, if the multilayer wiring structure which has the wiring grids only in the X-Y direction is applied, an H type wiring structure shown in FIG. 16B are repeated, as shown in FIG. 16D.

Figure 16A:
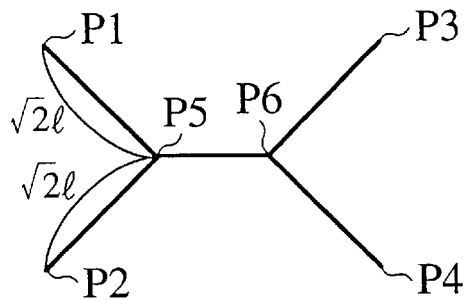
FIGS. 16A to 16D are views each showing a basic structure of a clock tree in a semiconductor integrated circuit device according to a ninth embodiment of the present invention.
Figure 16B:
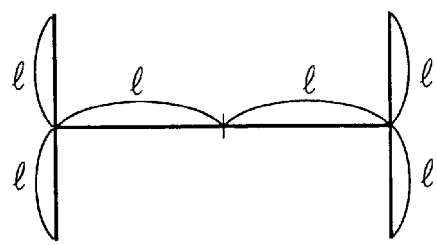
Figure 16C:
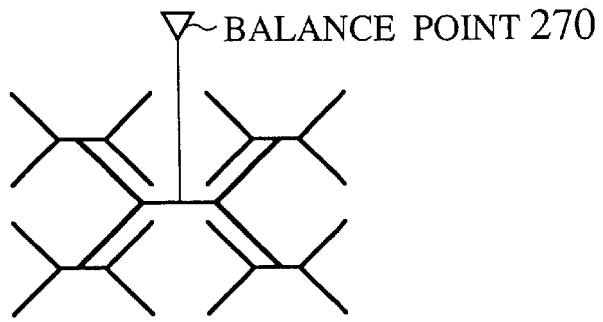
Figure 16D:
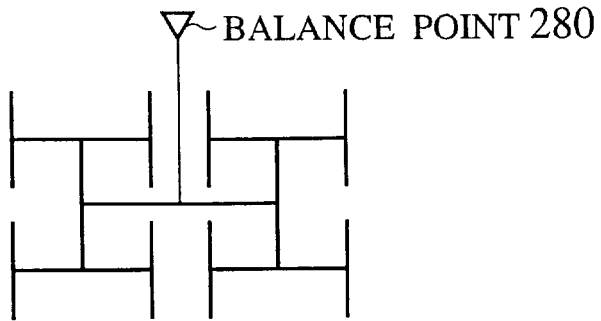

In order to construct such tree wiring route, as shown in FIG. 16C, the ninth embodiment employs a repetitive structure using oblique wirings shown in FIG. 16A. More particularly, as shown in FIG. 16A, routes are extended from four points P1, P2, P3, P4 by using the oblique wiring lattices so as to come close to each other. Then, if branch points P5 and P6, which are formed by coupling the routes from P1, P2 and P3, P4 respectively, are connected via a wiring on any one of the longitudinal and lateral wiring layers, a structure shown in FIG. 16A can be constructed. In this case, the branch points P5 and P6 of the route are positioned such that they make the delay on the downstream side of signal propagation to coincide with each other.

By comparing the H type wiring structure shown in FIG. 16B in the prior art with the wiring structure shown in FIG. 16A in the ninth embodiment, difference of the wiring length is merely several %, nevertheless such difference is significant difference in the RC delay of the wiring. Assume that each wiring layer has equal wiring resistance R of each wiring layer per unit length and the equal wiring capacitance C, and also no capacitive load is not connected to the end. Here, the wiring delay $D_H$ of the H type wiring structure shown in FIG. 16B in the prior art is obtained as follows:

$$D_H = rl(2cl) + \tfrac{1}{2}rlcl = 2.5rcl^2 \qquad (1)$$

,where "l" denotes wiring length in FIGS. 16A to 16D.

On the other hand, the wiring delay $D_d$ of the wiring structure shown in FIG. 16A in the ninth embodiment is obtained as follows:

$$D_d = \tfrac{1}{2}r(\sqrt{2}l)c(\sqrt{2}l) = rcl^2 \qquad (2)$$

Note that the distance between P5 and P6 in FIG. 16A is very minute so that the distance can be ignored in calculation of (2). Accordingly, the wiring structure shown in FIG. 16A in the ninth embodiment can reduce the RC delay by an amount of $$D_H - D_d = (2.5 - 1)rcl^2 = 1.5rcl^2 \qquad (3)$$

rather than the H type wiring structure shown in FIG. 16B.

This reduction of the RC delay can be achieved because the wiring branch is located near the upstream side of signal propagation. Also, this reduction of the RC delay can be enhanced much more if the load capacitance is connected to the downstream side. In addition, since normally the wiring resistance of the employed oblique wiring is smaller than the wiring resistance of the X-Y wiring, this reduction of the RC delay can be further increased with regard to this respect.

Figure 17:
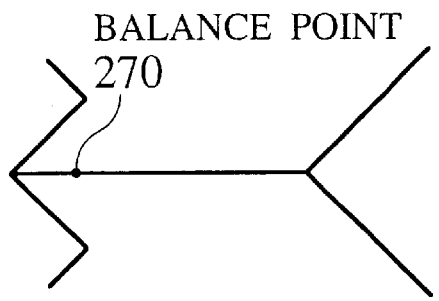
FIG. 17 is a view showing a modified structure of the clock tree in the semiconductor integrated circuit device according to the ninth embodiment of the present invention.

If the clock terminals are distributed nonuniformly, sometimes a balance point of the delay cannot be set on the line in FIG. 16A. In such case, the wiring structure is modified, as shown in FIG. 17. The balance point can be set precisely by using the wiring structure in FIG. 17. This wiring structure in FIG. 17 may be partially employed in the overall clock tree in FIG. 16C.

Figure 18A:
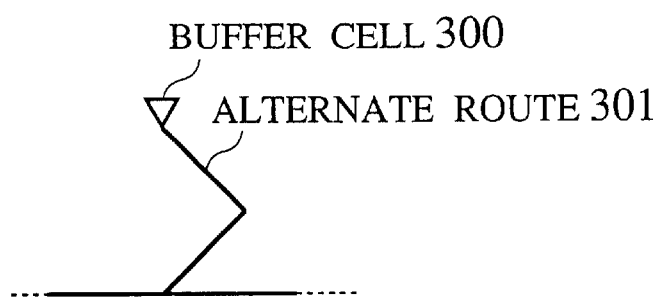
FIGS. 18A and 18B are views each showing a structure of a substantial portion of a clock tree when an alternate route is provided.
Figure 18B:
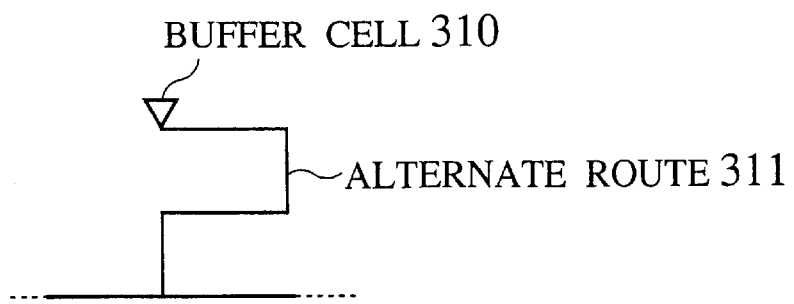

As shown in FIG. 18B, an alternate route 311 is sometimes provided near the output terminal of the buffer 310, which is inserted in the middle of the tree, to make the delay of the buffers uniform. In this case, if the oblique wiring shown in FIG. 18A is used, the number of the via holes can be reduced. Therefore, according to the structure shown in FIG. 18A, advantageous effects can be achieved in reduction in the resistance of the via hole and improvement in the electromigration tolerance.

Figure 19A:
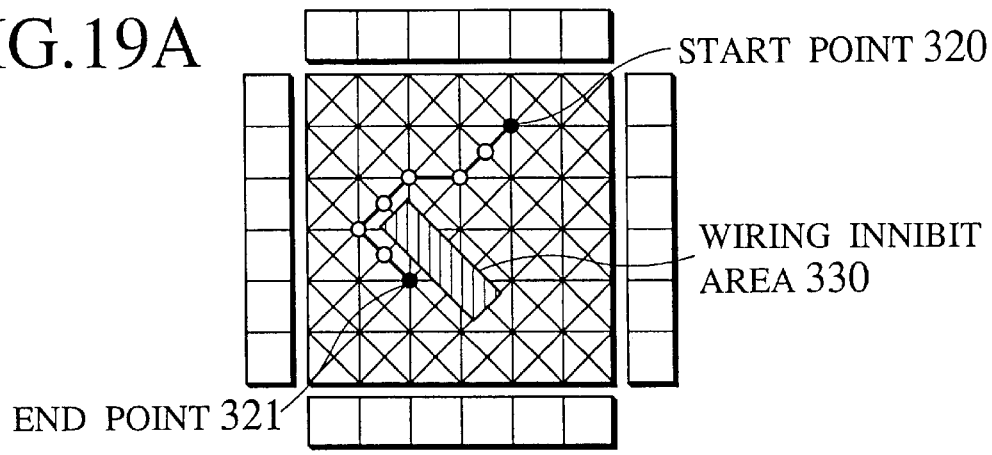
FIGS. 19A to 19C are views each showing a particular wiring method when an oblique wiring grid is provided by virtue of automatic wiring.
Figure 19B:
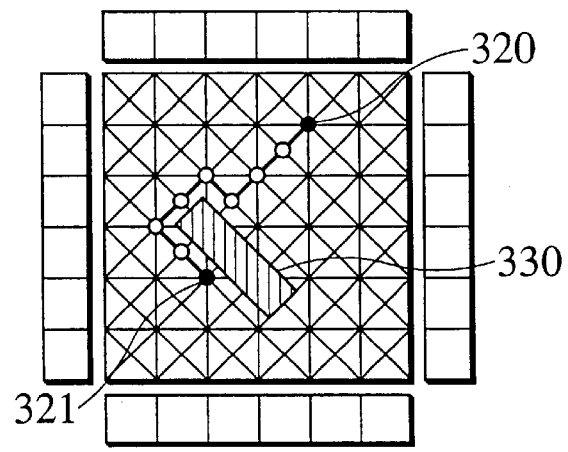
Figure 19C:
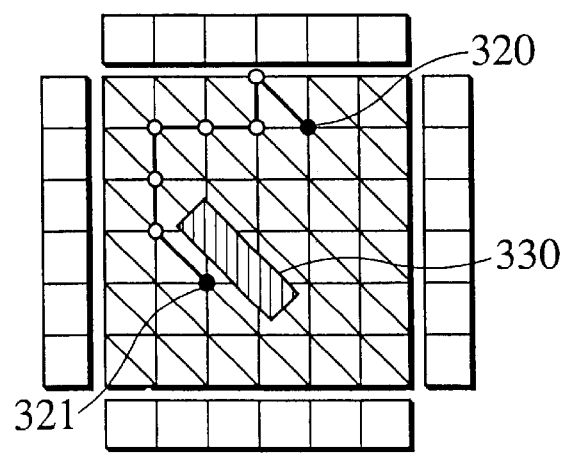

Then, examples of wiring design which uses a mazerunning router as a particular wiring method when the 45° and 135° oblique wiring grids are provided by virtue of automatic wiring are shown in FIGS. 19A to 19C. References 320, 321 in FIGS. 19A to 19C denote a start point and an end point of a terminal pair, which are connected to each other. A reference 330 denotes a wiring inhibit area in a chip core area. The wiring is arranged via the route indicated by a thick line in each of FIGS. 19A to 19C from the start point 320 to the end point 321. An example in FIG. 19A shows the case where the X-Y wiring and the oblique wiring are combined together. An example in FIG. 19B shows the case where only the oblique wiring is used. An example in FIG. 19C shows the case where the X-Y wiring and the 135° oblique wiring are used.

As described above, according to the ninth embodiment, in the structure of the tree route, the structure obtained by combining the unit wiring structure which utilizes the oblique wiring is employed. As a result, the RC delay of the wiring can be reduced and thus the optimum clock tree can be constructed.

Tenth Embodiment

According to a tenth embodiment, in the multilayer wiring structure in which the oblique wiring grids according to the above embodiments are utilized, the wiring resource in the cell row direction can be increased by constructing the X-Y wiring grids in FIG. 3 by using three-layered orthogonal wirings.

Figure 20:
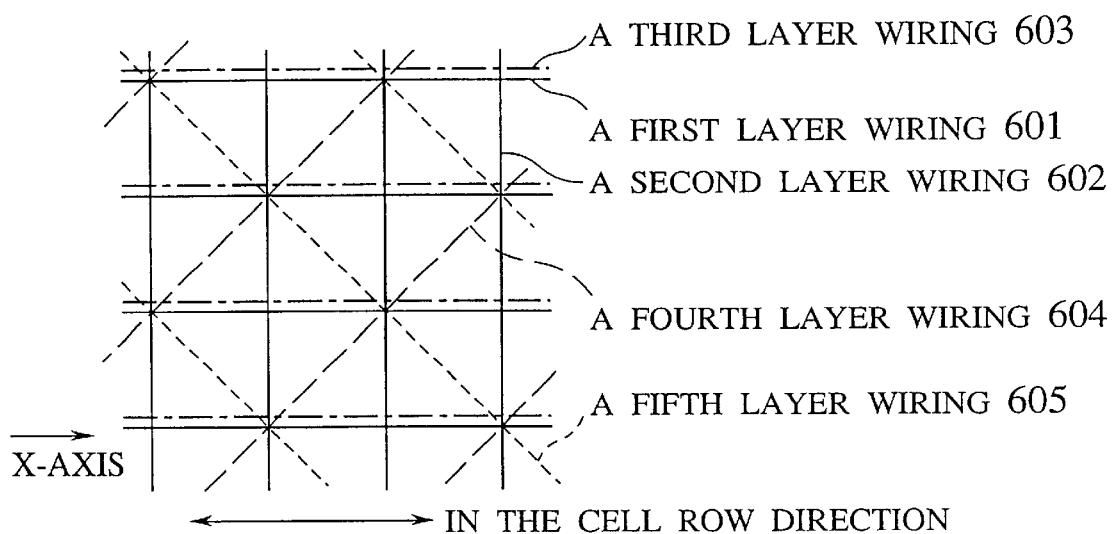
FIG. 20 is a view showing a layout of a wiring grid structure of a semiconductor integrated circuit device according to a tenth embodiment of the present invention.
Figure 21:
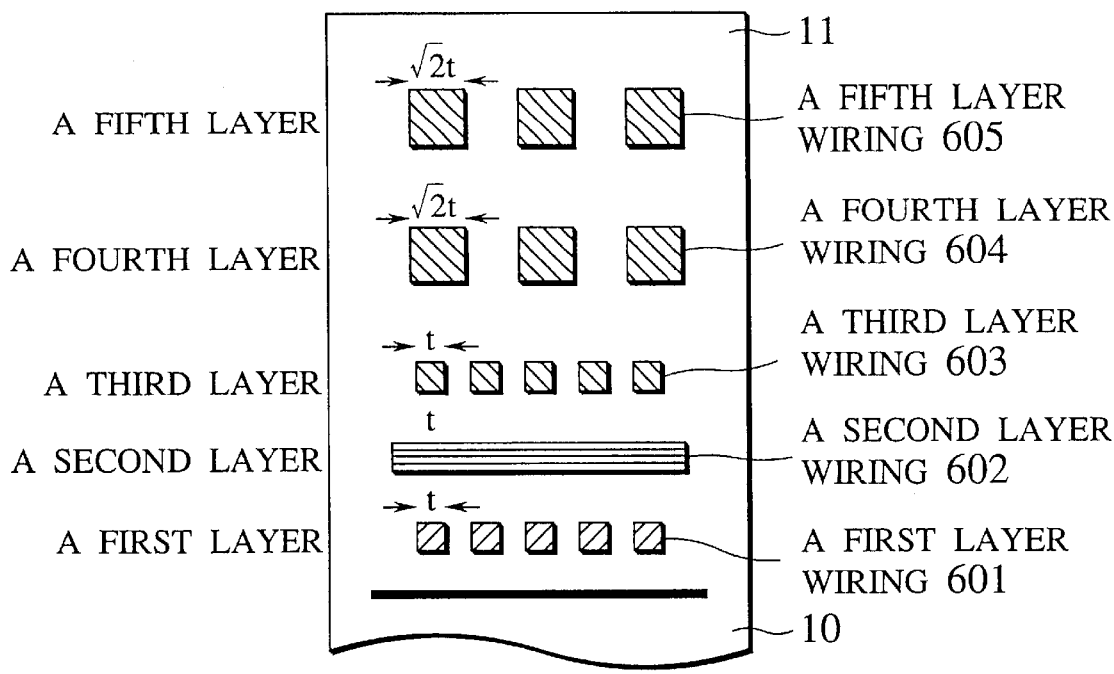
FIG. 21 is a sectional view showing the wiring grid structure shown in FIG. 20, which is viewed from the X-axis direction.

FIG. 20 is a view showing a layout of a wiring grid structure of a semiconductor integrated circuit device according to the tenth embodiment of the present invention. FIG. 21 is a sectional view showing the wiring structure which is implemented based on the wiring grid structure shown in FIG. 20, which is viewed from the X-axis direction in FIG. 20.

In FIG. 20, the X-Y wiring grid is composed of a three-layered wiring. More specifically, as shown in FIG. 20, a wiring which consists of a first layer wiring 601, a second layer wiring 602, and a third layer wiring 603, and a fourth layer wiring 604 and a fifth layer wiring 605 constitute an orthogonally intersecting grid respectively. The tenth embodiment provides the third layer wiring 603 which is in parallel with the first layer wiring 601. That is, a wiring grid is arranged such that the fourth layer wiring 604 and the fifth layer wiring 605 intersect with the first layer wiring 601 and the third layer wiring 603 by angles of 45° and 135° respectively.

A reference 601 in FIG. 20 is a wiring grid of the first layer. A wiring grid 602 of the second layer is then formed on the wiring grid 601 of the first layer to intersect orthogonally with the first layer. A wiring grid 603 of the third layer is then formed on the wiring grid 602 of the second layer to intersect orthogonally with the second layer. A wiring grid 604 of the fourth layer is then formed in the 45° oblique direction relative to the wiring grid 601 of the first layer and the wiring grid 603 of the third layer. A wiring grid 605 of the fifth layer is then formed in the 135° oblique direction relative to the wiring grid 601 of the first layer and the wiring grid 603 of the third layer.

Like the first embodiment, in the tenth embodiment, wiring pitches of the wiring grid 604 of the fourth layer and the wiring grid 605 of the fifth layer, which are arranged in the oblique direction, are set $\sqrt{2}$ times ($\sqrt{2} \cdot \lambda$) of those ($\lambda$) of the wiring grid 601 of the first layer, the wiring grid 602 of the second layer, and the wiring grid 603 of the third layer respectively. Also, the wiring width of the wiring grid 604 of the fourth layer and the wiring grid 605 of the fifth layer, which are arranged in the oblique direction, are set $\sqrt{2}$ times ($\sqrt{2} \cdot t$) of those (t) of the wiring grid 601 of the first layer, the wiring grid 602 of the second layer, and the wiring grid 603 of the third layer respectively. In this case, it is preferable that wirings in the wiring grid 601 of the first layer, the wiring grid 602 of the second layer, and the wiring grid 603 of the third layer should be defined by minimum wiring width, height, wiring pitch which are decided by the design rule used in wiring design.

Returning to FIG. 20, the wirings of the wiring grid 601 of the first layer and the wiring grid 603 of the third layer are formed in parallel with the cell row direction. Therefore, in contrast to the first embodiment, the wiring resource in the cell row direction can be further increased. The tenth embodiment differs from the third embodiment in that no routing channel is provided.

In the multilayer wiring structure which employs the wiring lattices being orthogonally intersected in the X-Y direction in the prior art, the cross talk noise is generated due to parallel arrangement of the wiring in the case that the wirings of plural layers are formed in parallel. In the tenth embodiment, while suppressing generation of the cross talk noise, the wiring resource in the cell row direction can be assured by using the oblique wiring grid and parallel arrangement of the wiring in combination.

As described above, according to the tenth embodiment, the wirings of the first layer and the third layer are formed in parallel with the cell row, and then the above oblique wiring grids are formed thereon. As a result, the wiring resource in the cell row direction can be secured.

As a modification of the tenth embodiment, another wiring grid of one layer or plural layers may be formed on the oblique wiring lattice which consists of the wiring grid 604 of the fourth layer and the wiring grid 605 of the fifth layer. Such another wiring grid can be constructed by forming a pair of wiring grids, which consists of the orthogonally intersecting wirings of the sixth layer and the seventh layer, on the fifth layer sequentially and repeatedly to have an angle of 45° with respect to the wiring grid 605 of the fifth layer. In other words, in addition to the reference wiring grids which consist of the wirings of the first layer, the second layer, and the third layer and the oblique wiring grids which consists of the wirings of the fourth layer and the fifth layer, a wiring structure of q layers in which a pair of orthogonally intersecting wiring grids of the (p−1)-th layer and the p-th layer are formed to have an angle of 45° relative to the wirings of the (p−2)-th layer can be provided (where $q \geq 5$).

The wiring pitches of the orthogonally intersecting wirings of the (p−1)-th layer and the p-th layer are set $\sqrt{2}$ times of that of the wiring of the (p−2)-th layer respectively. Also, the wiring widths of the wirings of the (p−1)-th layer and the p-th layer are set $\sqrt{2}$ times of that of the wiring of the (p−2)-th layer respectively. In this case, it is preferable that wirings in the wiring grid 601 of the first layer, the wiring grid 602 of the second layer, and the wiring grid 603 of the third layer should be defined by minimum wiring width, height, wiring pitch which are decided by the design rule used in wiring design.

According to this modification, the integration density of the circuit can be improved and also the RC delay of the wiring can be reduced.

Eleventh Embodiment

According to an eleventh embodiment, in the multilayer wiring structure in which the oblique wiring grids according to the above embodiments are utilized, a circuit speed can be improved by using the wirings of the layer constituting the oblique wiring grid as the global wirings which are relatively long wiring.

Figure 22:
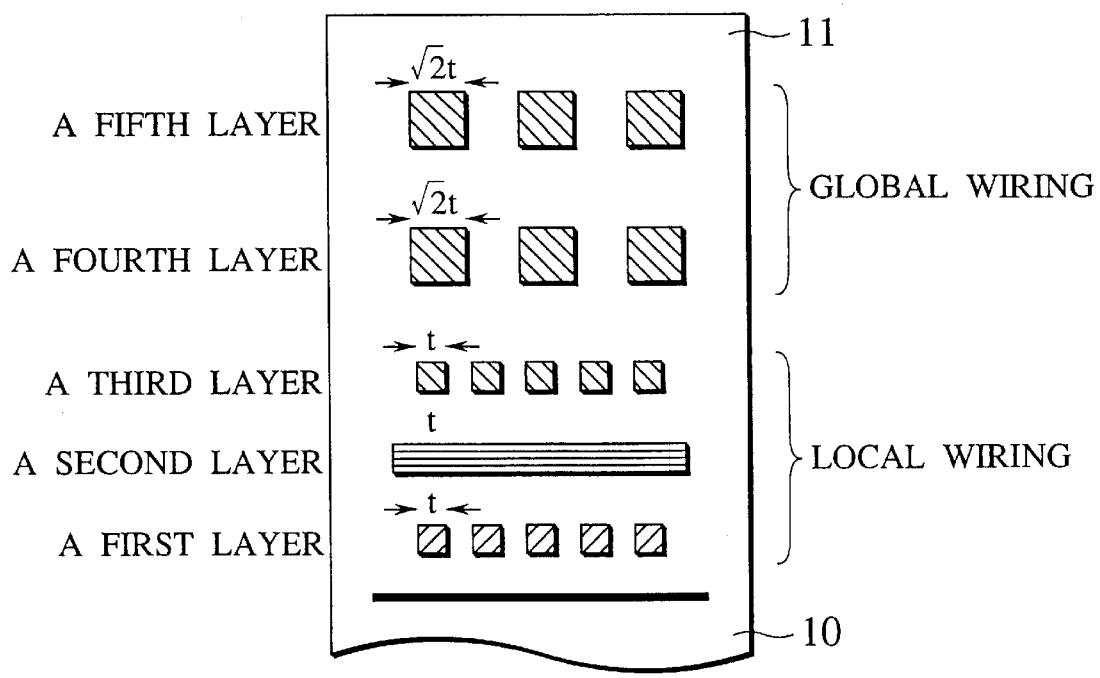
FIG. 22 is a sectional view showing a wiring grid structure of a semiconductor integrated circuit device using global wirings and local wirings, according to an eleventh embodiment of the present invention.
Figure 23:
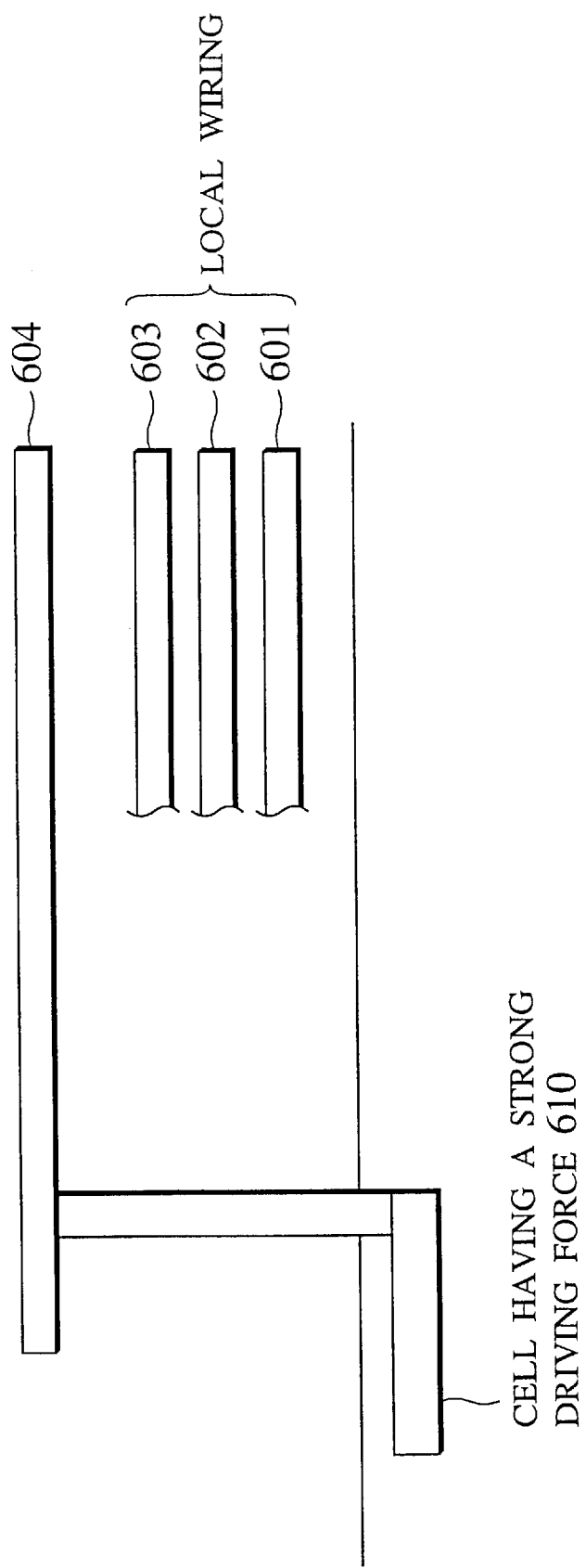
FIG. 23 is a view showing direct connection from a cell with a strong driving force to a wiring of the oblique wiring grid in the eleventh embodiment of the present invention.

FIG. 22 is a sectional view showing wiring arrangement according to the eleventh embodiment of the present invention. FIG. 23 is a view showing global wirings in the eleventh embodiment of the present invention. For convenience of understanding, like the tenth embodiment, the case will be explained in the following where the X-Y wiring grids are formed by the wirings of the first layer, the second layer, and the third layer and the oblique wiring grids are formed by the wirings of the fourth layer and the fifth layer. However, it is needless to say that this can also be applied to the case where the X-Y wiring grids are formed by the wirings of the first layer and the second layer which are indicated in the first embodiment.

As shown in FIG. 22, in the eleventh embodiment, overlying wirings on the fourth layer and the fifth layer consisting of the oblique wiring grid are used as the global wirings. Normally, the delay characteristic is critical in the global wirings. Since a circuit speed of the overall chip is influenced by this delay characteristic, the RC delay of the wiring becomes an issue particularly. In the above embodiments, the RC delay of the overlying wirings is half (½) of that of the underlying wirings (X-Y wirings). Therefore, if the wirings of the oblique wiring grid acting as the overlying wirings are used as the global wirings, an operation speed of the circuit can be improved. In contrast, it is desired that the underlying wirings (X-Y wirings) are used as the local wirings.

Where the "global wiring" is a wiring which is used as a clock net (clock wirings) which is spread over the entire chip, a bus, a power supply supplementary line, etc. For example, in the case of 0.25 μm design rule, assuming the global wiring as a wiring having a wiring distance of more than about 2.5 mm, the RC delay of the wiring is about 1.4 nsec. The "local wiring" means a wiring having a wiring distance shorter than the above distance.

Figure 24:
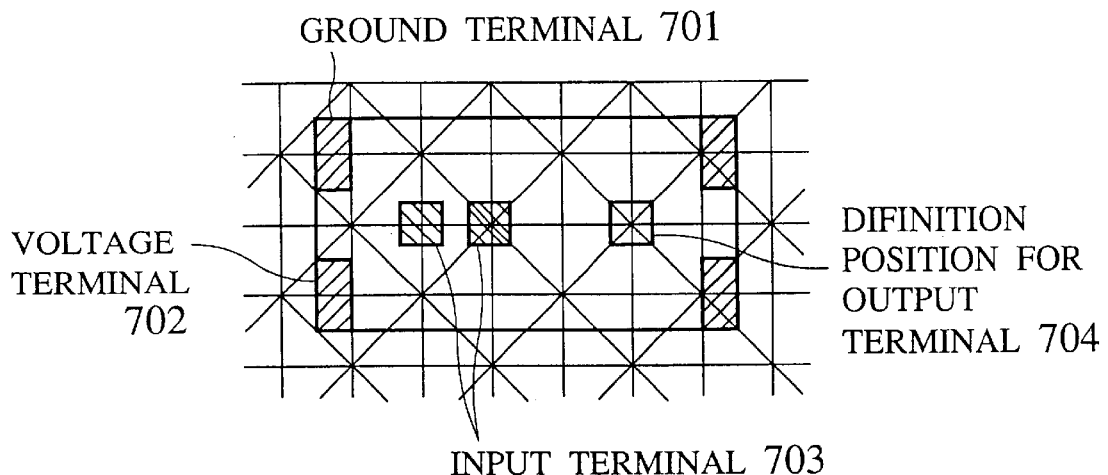
FIG. 24 is a view showing a definition position of an output terminal of the cell with the strong driving force in FIG. 23.

The wiring pitch of the X-Y wirings (underlying wirings) used as the local wirings is set narrower than that of the oblique wirings (overlying wirings). In this case, as shown in FIG. 23, preferably a cell 610 having a strong driving force, e.g., the clock buffer cell, the buffer cell for the bus, etc., should not be connected via various wirings (601 to 604) every time, but directly connected to the global wiring. Therefore, in the eleventh embodiment, the output terminal of the cell with the strong driving force is formed into a shape which can be connected directly to the wirings of the oblique wiring grid of the fourth layer or more. As shown in FIG. 24, an output terminal 704 of the cell having the strong driving force can be defined at orthogonally intersecting access points of the overlying oblique wiring grid.

If the output terminal of these cells are formed into the shape which can be directly connected to the global wirings, a wiring length for these cells can be reduced and wiring design can be facilitated. In addition, since these cells are connected directly to the overlying wirings of the oblique wiring grid of the fourth layer or more, the number of the via hole can be reduced and also the resistance due to the via hole can be reduced.

As described above, according to the eleventh embodiment, the wirings of the wiring layer constituting the oblique wiring grid are employed as the global wirings which are the relatively long wiring. As a result, the RC delay of the wirings which have an influence on the circuit characteristic can be reduced and also the circuit speed can be improved.

Twelfth Embodiment

According to a twelfth embodiment, in the multilayer wiring structure in which the oblique wiring grids according to the above embodiments are utilized, with respect to a clock wiring structure for supplying a clock from a PLL (Phase Locked Loop) circuit, a wiring is provided from the PLL circuit to a chip center by using the oblique wiring grid and then wirings are defined from the chip center to flip-flops by the tree structure, so that an RC product is balanced.

Figure 25A:
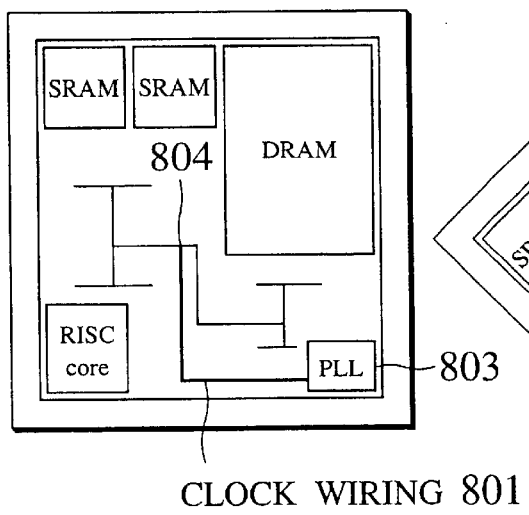
FIG. 25A is a view showing a wiring structure of a clock supply line from a PLL to flip-flops in the prior art.
Figure 25B:
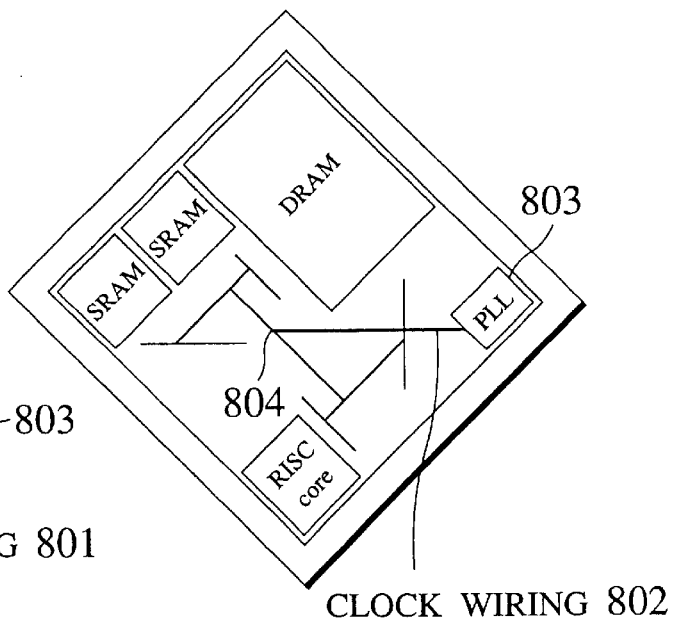
FIG. 25B is a view showing a wiring structure of a clock supply line from a PLL to flip-flops according to a twelfth embodiment of the present invention.
Figure 26:
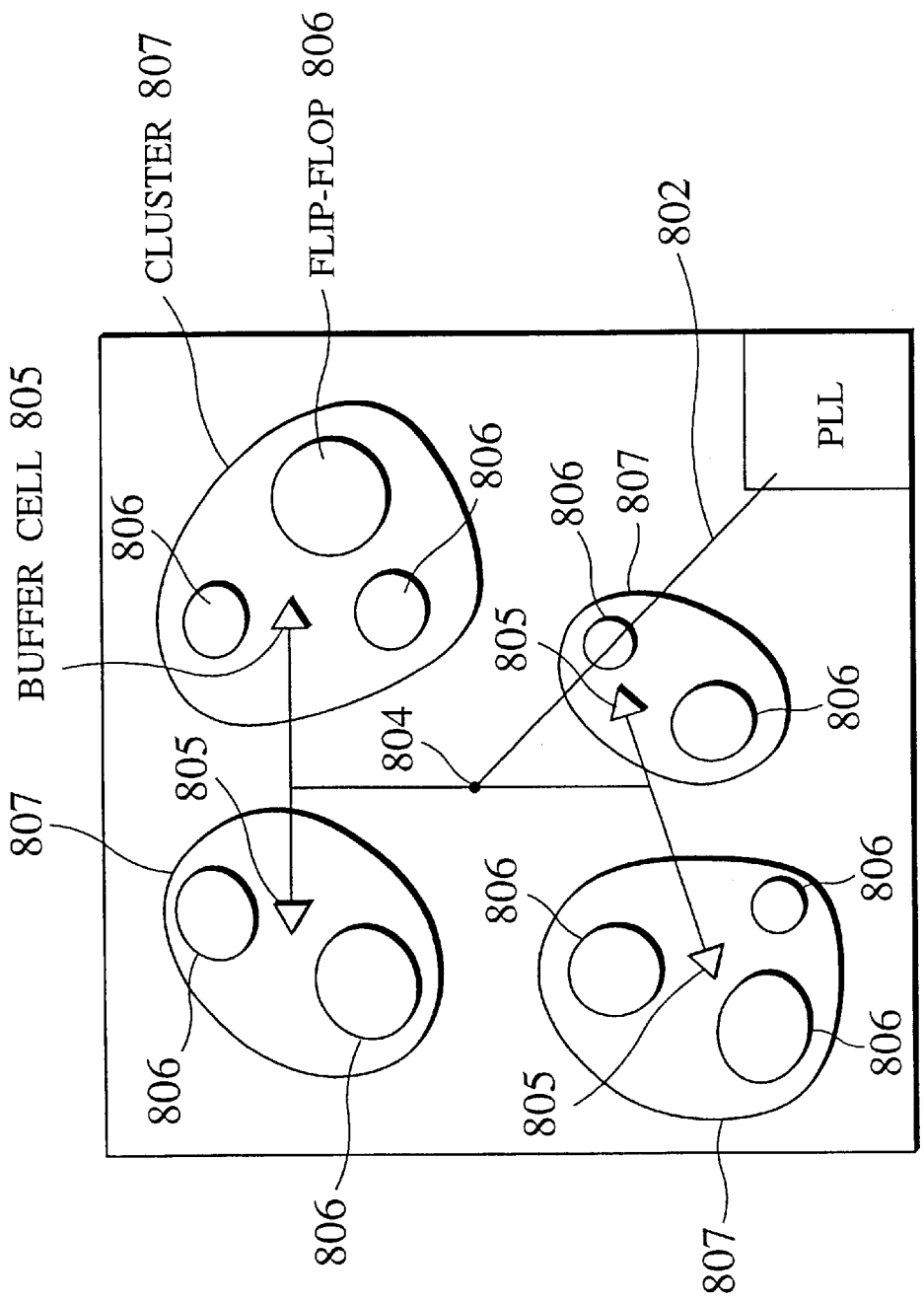
FIG. 26 is a view showing another wiring structure of a clock supply line from a PLL to flip-flops according to a twelfth embodiment of the present invention.
Figure 27:
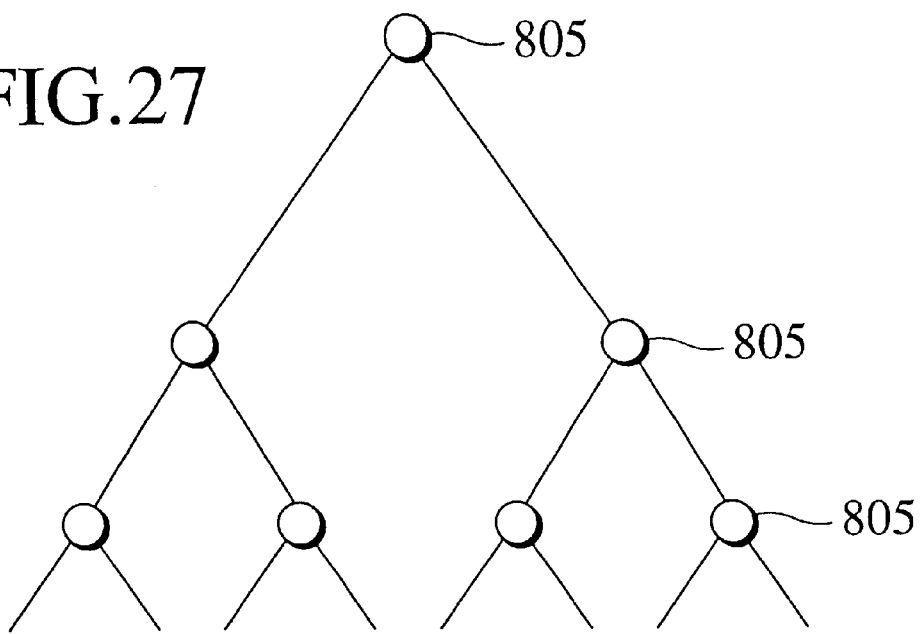
FIG. 27 is a view showing a clock tree structure according to the twelfth embodiment of the present invention.
Figure 28:
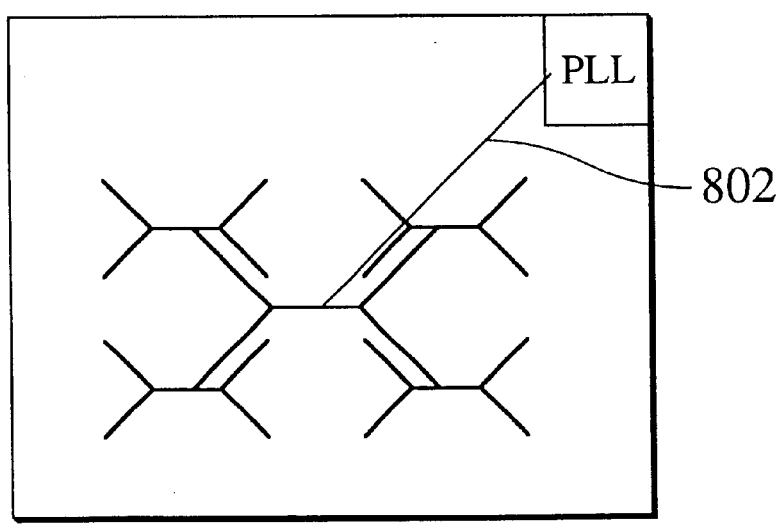
FIG. 28 is a view showing another clock tree structure according to the twelfth embodiment of the present invention.

FIG. 25A is a view showing a wiring approach for a clock supply wiring from the PLL to the flip-flops in the prior art. Since a PLL 803 is a sensitive analog cell, such PLL must be arranged at the end portion of the chip because of the circuit characteristic. Hence, according to the conventional approach using the X-Y wiring 801, the wiring length becomes longer. FIG. 25B is a view showing a wiring approach for the clock supply wiring from the PLL to the flip-flops according to the twelfth embodiment of the present invention. In the twelfth embodiment, the clock supply wiring 802 from the PLL 802 to the chip center 804 is provided by using the oblique wiring grid. Therefore, the wiring length can be reduced and the RC delay of the wiring can be reduced. As shown in FIG. 26, the wirings are provided from the chip center to respective clusters consisting of the flip-flops via the buffer cells. FIG. 27 is a view showing a clock tree structure according to the twelfth embodiment. As shown in FIG. 27, the clock wiring routes are formed from the buffer cells so as to balance the RC product. In other words, the clock wiring routes are formed hierarchically from the chip center so as to balance the delay in the X-Y direction and the oblique direction. This hierarchical clock tree may be constructed in the same way as the above ninth embodiment, as shown in FIG. 28. Note that the PLL may be replaced with DLL.

The overlying oblique wiring grid is used preferentially in these clock wiring routes, and preferably the wiring width is set wide. More particularly, if the wiring pitch of the oblique wiring grid is set $\sqrt{2}$ times of that of the underlying X-Y wiring grid, it is easy to use a thick wiring width in the oblique wiring lattice. As a result, increase in the RC delay of the wiring owing to reduction in the wiring resistance R can be suppressed.

As described above, according to the twelfth embodiment of the present invention, the oblique wiring grid is employed as the clock supply wiring from the PLL to the chip center, and then the clock wiring routes are formed hierarchically from the chip center to the flip-flops on the chip so as to balance the delay in the X-Y direction and the oblique direction. As a result, the wiring length to supply the clock can be reduced and also the RC delay of the wiring can be reduced.

Thirteenth Embodiment

According to a thirteenth embodiment, in the multilayer wiring structure in which the oblique wiring grids according to the above embodiments are utilized, in case SRAM is arranged on the chip, the wirings passing over the SRAM are provided by using the oblique wiring lattice. In the thirteenth embodiment, the SRAM may be replaced with DRAM.

Figure 29:
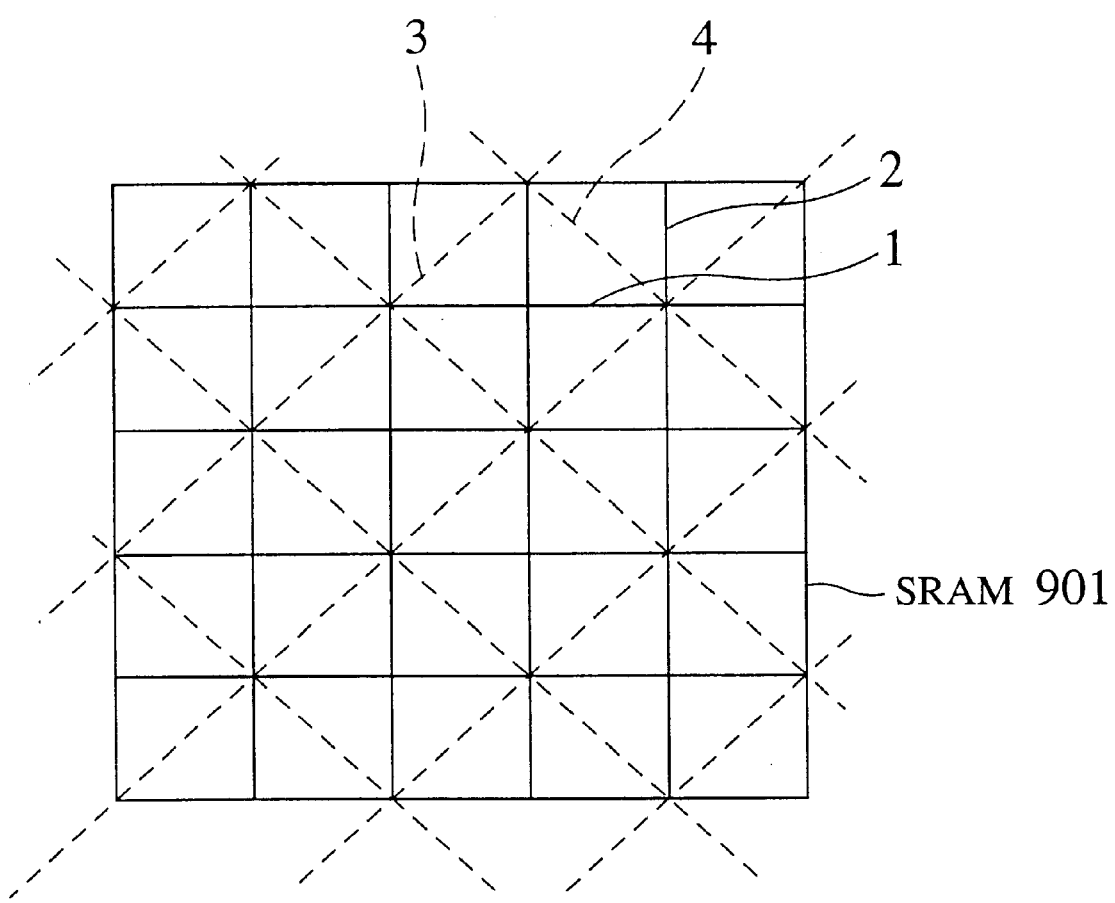
FIG. 29 is a view showing a layout of a wiring grid structure of a semiconductor integrated circuit device according to a thirteenth embodiment of the present invention.

FIG. 29 is a view showing a layout of a wiring grid structure of a semiconductor integrated circuit device according to the thirteenth embodiment of the present invention. The underlying X-Y wiring layers 1, 2 are employed as word lines and bit lines, for example, and formed in an SRAM 901. The passing wirings 3, 4 are wired by using the overlying oblique wiring grid. In other words, unlike the prior art, the underlying X-Y wiring layers 1, 2 provided in the SRAM 901 and the passing wirings 3, 4 are not provided in parallel. As a result, the coupling noise can be reduced rather than the prior art.

As described above, according to the thirteenth embodiment, the passing wirings passing over the memory are formed by using the oblique wiring grid to have an intersecting angle of 45° or 135° relative to the wirings in the memory. As a result, the coupling noise between the wiring in the memory and the passing wirings can be reduced.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of wiring elements of a multi-layer wiring structured semiconductor integrated circuit, comprising the steps of:
   forming an X-Y reference wiring layer constituting a total of M (M≧2) layers in which an n-th (n≧2) layer wiring intersects orthogonally with a (n−1)-th layer wiring;
   forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and(m+2)-th layer wiring in the oblique wiring layer has a wiring pitch of √2 times of that of wiring in the reference wiring layer, and a wiring width of √2 times of that of respective layers in the reference wiring layer, the (M+1 )-th layer wiring and the (M+2 )-th layer wiring being provided in the oblique wiring layer formed over the XY reference wiring layer; and
   forming a conductive via hole configured to connect X-Y wirings in the reference wiring layer with oblique wirings in the oblique wiring layer, the conductive via hole being positioned at intersecting point of the X-Y wirings and the oblique wirings.

2. The method of claim 1, further comprising the steps of:
   extracting wiring nets which delay in excess of a prescribed delay time from wiring nets constructed by the wiring in the reference wiring layer; and
   inserting signal amplifying buffer cell into a position, which can be connected to wiring of the oblique wiring layer, on the extracted wiring nets.

3. The method according to claim 1, further comprising the steps of:
   (a) defining cells consisting of the plurality of unit elements; and
   (b) defining obstruction area, in which no wiring is provided, in the cell along wiring direction of the oblique wiring layer.

4. The method of claim 3, wherein the step (b) arranges the (m+1)-th layer wiring or the (m+2)-th layer wiring near their corner portions.

5. The method of claim 1, further comprising the steps of:
   when one wiring of two parallel wirings, which correspond to two wirings of the M layers of the reference wiring lattice and belong to a same layer, generates noises onto other wiring, replacing a prescribed portion in a middle of any one wiring of two wirings with wiring of the oblique wiring layer.

6. The method according to claim 5, further comprising the steps of:
   inserting buffer cell in route of wiring of the oblique wiring layer, the wiring being employed in replacement.

7. The method of claim 1, further comprising the steps of:
   setting first route which is extended from a first point and a second point on the wiring of the oblique wiring layer so as to come close to each other;
   setting second route which is extended from a third point and a fourth point on the wiring of the oblique wiring layer so as to come close to each other;
   forming unit wiring structure which is formed by connecting the first route and the second route via wiring of the reference wiring layer; and
   forming tree type wiring route which supplies a clock signal to a cell consisting of the plurality of unit elements by combining the unit wiring structures.

8. A method of arranging cells on a multi-layer wiring structured semiconductor integrated circuit, comprising the steps of:
   forming an X-Y reference wiring layer constituting a total of M (M≧2) layers in which an n-th (n≧2) layer wiring intersects orthogonally with a (n−1)-th layer wiring;
   forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and (m+2)-th layer wiring in the oblique wiring layer has a wiring pitch of √2 times of that of wiring in the reference wiring layer, the (m+1)-th layer wiring being provided in the oblique wiring layer formed over the X-Y reference wiring layer,
   forming a conductive via hole configured to connect X-Y wirings in the reference wiring layer with oblique wiring layer, the conductive via hole being positioned at intersecting point of the X-Y wirings and the oblique wirings, and
   arranging cell consisting of a plurality of unit elements based on a prescribed cut method utilizing X-Y cut lines which correspond to wiring directions of the reference wiring layer and oblique cut lines which correspond to wiring directions of the oblique wiring layer.

9. A method of wiring elements of a multi-layer wiring structured semiconductor integrated circuit, comprising the steps of:

forming an X-Y reference wiring layer constituting a total of M (m≧2) layer in which an n-th (n≧2) layer wiring intersects orthogonally with a (n−1)-th layer wiring;

forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and (m+2)-th layer wiring in the oblique wiring layer has a wiring pitch of $\sqrt{2}$ times of that of wiring in the reference wiring layer;

forming a conductive via hole configured to connect X-Y wirings in the reference wiring layer with oblique wirings in the oblique wiring layer, the conductive via hole being positioned at intersecting point of the X-Y wirings and the oblique wirings;

providing wiring from a PLL (Phase Locked Loop) arranged at a corner of a chip to a center of the chip, by using wiring of the oblique wiring layer; and providing hierarchically wiring from the center of the chip to flip-flop circuits in the chip via buffer cells so as to balance an RC product.

10. A method of wiring elements of a multi-layer wiring structured semiconductor integrated circuit, comprising the steps of:

forming an X-Y reference wiring layer constituting a total of M (M≧2) layer in which an n-th (n≧2) layer wiring intersects orthogonally with a (n−1)-th layer wiring;

forming an oblique wiring layer which is positioned over the reference wiring layer to have an angle of 45 degree or 135 degree, the oblique wiring layer comprising a (m+1)-th layer wiring and a (m+2)-th layer wiring which are intersected orthogonally with each other, such that each one of (m+1)-th layer wiring and (m+2)-th layer wiring in the oblique wiring layer has a wiring pitch of $\sqrt{2}$ times of that of wiring in the reference wiring layer, the (m+1)-th layer wiring and the (m+2)-th layer wiring being provided in the oblique wiring layer formed over the X-Y reference wiring layer;

forming a conductive via hole configured to connect X-Y wirings in the reference wiring layer with oblique wirings in the oblique wiring layer, the conductive via hole being positioned at intersecting point of the X-Y wirings and the oblique wirings;

forming an SRAM circuit in which wiring of the reference wiring layer is used as its inner wiring; and forming wiring, which is passed over the SRAM circuit, on the oblique wiring layer.

* * * * *